United States Patent
Negoro et al.

(10) Patent No.: US 10,861,718 B2
(45) Date of Patent: Dec. 8, 2020

(54) SUBSTRATE PROCESSING METHOD AND SUBSTRATE PROCESSING APPARATUS

(71) Applicant: SCREEN Holdings Co., Ltd., Kyoto (JP)

(72) Inventors: Sei Negoro, Kyoto (JP); Kenji Kobayashi, Kyoto (JP)

(73) Assignee: SCREEN Holdings Co., Ltd.

( * ) Notice: Subject to any disclaimer, the term of this patent is extended or adjusted under 35 U.S.C. 154(b) by 0 days.

(21) Appl. No.: 16/232,103

(22) Filed: Dec. 26, 2018

(65) Prior Publication Data

US 2019/0221450 A1   Jul. 18, 2019

(30) Foreign Application Priority Data

Jan. 15, 2018   (JP) ................. 2018-004531

(51) Int. Cl.
*H01L 21/311* (2006.01)
*B05C 5/00* (2006.01)
*H01L 21/67* (2006.01)

(52) U.S. Cl.
CPC .......... *H01L 21/6708* (2013.01); *B05C 5/002* (2013.01); *H01L 21/67017* (2013.01); *H01L 21/67028* (2013.01)

(58) Field of Classification Search
None
See application file for complete search history.

(56) References Cited

U.S. PATENT DOCUMENTS

| | | | |
|---|---|---|---|
| 5,795,494 A | 8/1998 | Hayami et al. ................. 216/83 |
| 6,187,216 B1 * | 2/2001 | Dryer ................ H01L 21/67086 216/95 |
| 2008/0078426 A1 | 4/2008 | Miya et al. ....................... 134/30 |
| 2009/0084409 A1 | 4/2009 | Okura et al. ..................... 134/21 |
| 2011/0220157 A1 | 9/2011 | Taira ............................... 134/36 |
| 2011/0240601 A1 | 10/2011 | Hashizume et al. ............ 216/83 |
| 2011/0294404 A1 * | 12/2011 | Dandu ................ B24B 37/0056 451/56 |
| 2013/0306238 A1 * | 11/2013 | Miura ................... B01F 1/0038 156/345.11 |
| 2015/0234296 A1 | 8/2015 | Yagi |

FOREIGN PATENT DOCUMENTS

| | | |
|---|---|---|
| JP | 2015-153947 A | 8/2015 |
| KR | 10-0185463 B1 | 4/1999 |
| KR | 10-2007-0094623 A | 9/2007 |
| KR | 10-2011-0102149 A | 9/2011 |

\* cited by examiner

*Primary Examiner* — Shamim Ahmed
(74) *Attorney, Agent, or Firm* — Ostrolenk Faber LLP

(57) ABSTRACT

One of a setting dissolved oxygen concentration and a setting atmosphere oxygen concentration is determined based on a required etching amount. Thereafter, based on the required etching amount and the one of the determined setting dissolved oxygen concentration and setting atmosphere oxygen concentration, the other of the setting dissolved oxygen concentration and the setting atmosphere oxygen concentration is determined. A low oxygen gas whose oxygen concentration is equal or approached to the determined setting atmosphere oxygen concentration flows into a chamber that houses a substrate. Furthermore, an etching liquid whose dissolved oxygen is reduced such that its dissolved oxygen concentration is equal or approached to the determined setting dissolved oxygen concentration is supplied to the entire region of the upper surface of the substrate held horizontally.

10 Claims, 10 Drawing Sheets

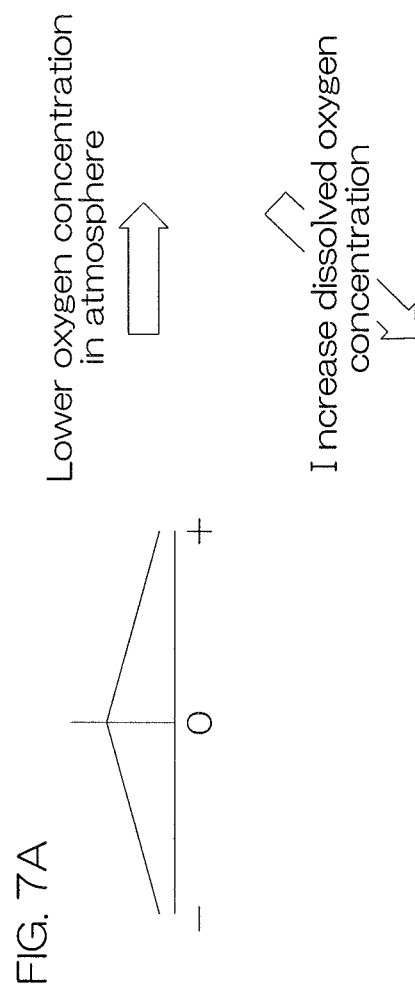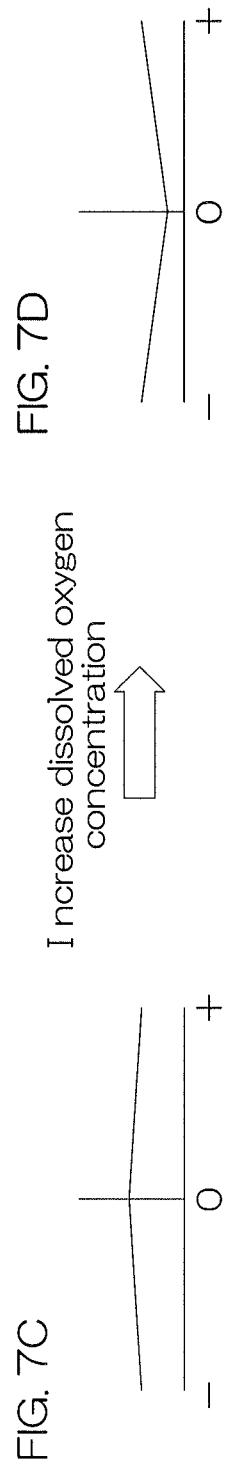

SUBSTRATE PROCESSING METHOD AND SUBSTRATE PROCESSING APPARATUS

CROSS REFERENCE TO RELATED APPLICATIONS

This application claims the benefit of priority to Japanese Patent Application No. 2018-004531 filed on Jan. 15, 2018. The entire contents of this application are hereby incorporated herein by reference.

BACKGROUND OF THE INVENTION

1. Field of the Invention

The present invention relates to a substrate processing method and a substrate processing apparatus that process a substrate. Examples of substrates to be processed include a semiconductor wafer, a substrate for a flat panel display (FPD) such as a liquid crystal display and an organic electroluminescence (organic EL) display, a substrate for an optical disc, a substrate for a magnetic disk, a substrate for a magneto-optical disc, a substrate for a photomask, a ceramic substrate, a substrate for a solar cell, and the like.

2. Description of Related Art

In the manufacturing process of a semiconductor device, a liquid crystal display, etc., a substrate processing apparatus is used which processes a substrate such as a semiconductor wafer or a glass substrate for a liquid crystal display. JP 2015-153947 A discloses a single substrate processing-type substrate processing apparatus which supplies a substrate with a processing liquid having a low dissolved oxygen concentration in a state where an oxygen concentration in an atmosphere is low.

SUMMARY OF THE INVENTION

Conventionally, as disclosed in JP 2015-153947 A, it is considered that it is preferable to minimize the dissolved oxygen concentration of the processing liquid and the oxygen concentration in the atmosphere. However, according to the study and research conducted by the present inventors, it was found that when a processing liquid is used to etch a substrate, not only the dissolved oxygen concentration of the processing liquid and an oxygen concentration in an atmosphere, but also a difference therebetween could affect the etching results.

For example, it is found that when the oxygen concentration in the atmosphere is excessively low with respect to the dissolved oxygen concentration of the processing liquid, the uniformity of the etching may be degraded. Hence, it is not necessarily preferable that the dissolved oxygen concentration of the processing liquid and the oxygen concentration in the atmosphere be low. It is also found that the distribution of the amount of etching over the entire region of the front surface or the rear surface of the substrate can be changed by controlling not only the dissolved oxygen concentration of the processing liquid and the oxygen concentration in the atmosphere but also a difference therebetween.

Hence, an object of the present invention is to provide a substrate processing method and a substrate processing apparatus which can etch a main surface of a substrate while controlling a distribution of an amount of etching by supplying an entire main surface of the substrate with an etching liquid having a low dissolved oxygen concentration in a state where an oxygen concentration in an atmosphere is low.

A preferred embodiment of the present invention provides a substrate processing method which includes a first oxygen concentration determination step of determining one of a setting dissolved oxygen concentration which indicates a setting value of a dissolved oxygen concentration of an etching liquid and a setting atmosphere oxygen concentration which indicates a setting value of an oxygen concentration in an atmosphere in contact with the etching liquid held on a main surface of a substrate, based on a required etching amount which indicates a required value of an amount of etching of the main surface of the substrate, a second oxygen concentration determination step of determining the other of the setting dissolved oxygen concentration and the setting atmosphere oxygen concentration based on the required etching amount and the one of the setting dissolved oxygen concentration and the setting atmosphere oxygen concentration determined in the first oxygen concentration determination step, a low oxygen gas supply step of causing a low oxygen gas, whose oxygen concentration is lower than an oxygen concentration of air and equal or approached to the setting atmosphere oxygen concentration determined in the first oxygen concentration determination step or the second oxygen concentration determination step, to flow into a chamber that houses the substrate, and an etching step of etching the main surface of the substrate by supplying an entire region of the main surface of the substrate held horizontally with the etching liquid whose dissolved oxygen is reduced such that the dissolved oxygen concentration of the etching liquid is equal or approached to the setting dissolved oxygen concentration determined in the first oxygen concentration determination step or the second oxygen concentration determination step, while causing the low oxygen gas that has flowed into the chamber in the low oxygen gas supply step to be in contact with the etching liquid held on the main surface of the substrate.

In this method, the etching liquid having a low dissolved oxygen concentration is supplied to the main surface of the substrate in a state where the oxygen concentration in the atmosphere is lowered. Thus, it is possible to supply the etching liquid to the entire region of the main surface of the substrate while controlling the amount of oxygen dissolved into the etching liquid held on the substrate. The actual dissolved oxygen concentration of the etching liquid supplied to the main surface of the substrate is equal or approached to the setting dissolved oxygen concentration. Similarly, the actual oxygen concentration in the atmosphere in contact with the etching liquid held on the main surface of the substrate is equal or approached to the setting atmosphere oxygen concentration.

The setting dissolved oxygen concentration and the setting atmosphere oxygen concentration are not set independently based on the required etching amount but are related to each other. Specifically, one of the setting dissolved oxygen concentration and the setting atmosphere oxygen concentration is determined based on the required etching amount. Then, based on the determined value (one of the setting dissolved oxygen concentration and the setting atmosphere oxygen concentration) and the required etching amount, the other of the setting dissolved oxygen concentration and the setting atmosphere oxygen concentration is determined. In other words, not only the setting dissolved oxygen concentration and the setting atmosphere oxygen concentration but also the difference between the setting dissolved oxygen concentration and the setting atmosphere oxygen concentration is controlled.

As described above, the setting dissolved oxygen concentration and the setting atmosphere oxygen concentration are lowered while controlling the difference between the setting dissolved oxygen concentration and the setting atmosphere oxygen concentration, and thus it is possible to change the distribution of the amount of etching over the main surface of the substrate without changing a landing position of the etching liquid with respect to the main surface of the substrate. For example, it is possible to uniformly etch the entire region of the main surface of the substrate with a constant amount of etching, and to etch the main surface of the substrate such that the distribution of the amount of etching is formed in the shape of a cone or an inverted cone. Hence, it is possible to etch the main surface of the substrate while controlling the distribution of the amount of etching.

The main surface of the substrate means either the front surface (device formation surface) or the rear surface (non-device formation surface) of the substrate. When the substrate is held horizontally, the upper surface or the lower surface of the substrate corresponds to the main surface. The main surface of the substrate may be any of the front surface and the rear surface of the substrate. The low oxygen gas means a gas which has an oxygen concentration lower than the oxygen concentration (about 21 vol %) of the air.

In the preferred embodiment, at least one of the following features may be added to the substrate processing method.

One of the first oxygen concentration determination step and the second oxygen concentration determination step includes either a step of determining, as the setting dissolved oxygen concentration, a value larger than a minimum value in a range of values which can be set as the setting dissolved oxygen concentration or a step of determining, as the setting atmosphere oxygen concentration, a value larger than a minimum value in a range of values which can be set as the setting atmosphere oxygen concentration.

In this method, a value which is larger than the minimum value in the range of values that can be set as the setting dissolved oxygen concentration or the setting atmosphere oxygen concentration is set as the setting dissolved oxygen concentration or the setting atmosphere oxygen concentration. In other words, unlike the conventional method in which the setting dissolved oxygen concentration and the setting atmosphere oxygen concentration are set to values as small as possible, the setting dissolved oxygen concentration, the setting atmosphere oxygen concentration and the difference therebetween are controlled. Thus, it is possible to etch the main surface of the substrate while the distribution of the amount of etching is being controlled.

The etching step includes a liquid discharge step of causing a liquid discharge port to discharge the etching liquid, whose dissolved oxygen is reduced such that the dissolved oxygen concentration of the etching liquid is equal or approached to the setting dissolved oxygen concentration determined in the first oxygen concentration determination step or the second oxygen concentration determination step, toward the main surface of the substrate held horizontally, while locating a landing position of the etching liquid, where the etching liquid discharged from the liquid discharge port first contacts the main surface of the substrate, in a central portion of the main surface of the substrate after start of the discharge of the etching liquid until stop of the discharge of the etching liquid.

In this method, the landing position of the etching liquid is positioned in the central portion of the main surface of the substrate after the start of the discharge until the stop of the discharge. In such a case as well, the difference between the setting dissolved oxygen concentration and the setting atmosphere oxygen concentration is controlled, and thus it is possible to control the distribution of the amount of etching. Hence, it is not necessary to move the landing position of the etching liquid with respect to the main surface of the substrate or to provide a plurality of liquid discharge ports which discharge the etching liquid toward the main surface of the substrate in order to control the distribution of the amount of etching.

The second oxygen concentration determination step is a step of determining, based on the required etching amount and the one of the setting dissolved oxygen concentration and the setting atmosphere oxygen concentration determined in the first oxygen concentration determination step, the other of the setting dissolved oxygen concentration and the setting atmosphere oxygen concentration such that the distribution of the amount of etching over the main surface of the substrate is formed in the shape of a cone or an inverted cone.

In this method, the setting dissolved oxygen concentration and the setting atmosphere oxygen concentration are set such that the distribution of the amount of etching over the main surface of the substrate is formed in the shape of a cone or an inverted cone. When the main surface of the substrate before the etching is in the shape of a cone, the main surface of the substrate is etched such that the distribution of the amount of etching over the main surface of the substrate is formed in the shape of a cone, and thus it is possible to improve the flatness of the main surface of the substrate after the etching. Similarly, when the main surface of the substrate before the etching is in the shape of an inverted cone, the main surface of the substrate is etched such that the distribution of the amount of etching over the main surface of the substrate is formed in the shape of an inverted cone, and thus it is possible to improve the flatness of the main surface of the substrate after the etching.

The first oxygen concentration determination step is a step of determining the setting dissolved oxygen concentration based on the required etching amount, and the second oxygen concentration determination step is a step of determining the setting atmosphere oxygen concentration based on the required etching amount and the setting dissolved oxygen concentration determined in the first oxygen concentration determination step.

In this method, after the setting dissolved oxygen concentration is determined, the setting atmosphere oxygen concentration is determined. The etching rate in the landing position depends on the dissolved oxygen concentration of the etching liquid. In other words, the setting atmosphere oxygen concentration does not significantly affect the etching rate in the landing position. Instead, the gradient of the etching rate, that is, the gradient of a straight line which connects the etching rate in the landing position and the etching rate in an arbitrary position within the main surface of the substrate depends on the dissolved oxygen concentration of the etching liquid and the oxygen concentration in the atmosphere. Hence, when the setting dissolved oxygen concentration is previously determined, the etching rate in the landing position and the gradient of the etching rate can be set relatively easily.

By contrast, when the setting atmosphere oxygen concentration is previously determined, the conditions other than the setting dissolved oxygen concentration and the setting atmosphere oxygen concentration may need to be changed. For example, when the setting atmosphere oxygen concentration is previously determined, in order to obtain the intended gradient of the etching rate, the setting dissolved oxygen concentration is significantly restricted. When the intended etching rate cannot be obtained by the determined setting dissolved oxygen concentration, another condition such as the time of supply of the etching liquid may need to be changed. Hence, the setting dissolved oxygen concentration is previously determined, and thus the etching rate in the landing position and the gradient of the etching rate can be set relatively easily.

The low oxygen gas supply step includes a step of causing the low oxygen gas to flow from an opening provided in an opposed surface of an opposed member to a space between the main surface of the substrate and the opposed surface of the opposed member, while causing the opposed surface of the opposed member which is movable within the chamber to face the main surface of the substrate.

In this method, the low oxygen gas which has an oxygen concentration lower than the oxygen concentration of the air flows out from the opening provided in the opposed surface of the opposed member and flows into the space between the main surface of the substrate and the opposed surface of the opposed member. Thus, the space between the substrate and the opposed member is filled with the low oxygen gas, and thus the oxygen concentration in the atmosphere is lowered. Hence, as compared with a case where the oxygen concentration is lowered in the entire internal space of the chamber, the used amount of low oxygen gas can be reduced, and thus it is possible to change the oxygen concentration in a short period of time.

The opposed member may be a shielding member which is movable vertically in the chamber and which is arranged above the substrate or may be a spin base which is rotatable around a vertical rotation axis within the chamber and which is arranged below the substrate.

The low oxygen gas supply step includes a step of causing the low oxygen gas to flow from a central opening, which is provided in the opposed surface of the opposed member and faces a central portion of the main surface of the substrate, to the space between the main surface of the substrate and the opposed surface of the opposed member and a step of causing the low oxygen gas to flow from an outer opening, which is provided in the opposed surface of the opposed member and faces a portion of the main surface of the substrate other than the central portion of the main surface of the substrate, to the space between the main surface of the substrate and the opposed surface of the opposed member.

In this method, the central opening and the outer opening are provided in the opposed surface of the opposed member. The central opening faces the central portion of the main surface of the substrate. The outer opening is arranged outside the central opening. The low oxygen gas flowing out from the central opening flows outward in the space between the substrate and the opposed member. Similarly, the low oxygen gas flowing out from the outer opening flows outward in the space between the substrate and the opposed member. Hence, as compared with a case where the outer opening is not provided, another gas is unlikely to flow in the space between the substrate and the opposed member. Thus, it is possible to more accurately control the oxygen concentration in the space between the substrate and the opposed member.

The low oxygen gas supply step includes a step of causing the low oxygen gas to flow from an upper end portion of the chamber into the chamber, while causing a gas within the chamber to flow out from a lower end portion of the chamber.

In this method, the low oxygen gas flows from the upper end portion of the chamber into the chamber. The low oxygen gas that has flowed into the chamber flows toward the lower end portion of the chamber and is discharged from the lower end portion of the chamber to the outside of the chamber. Thus, the interior of the chamber is filled with the low oxygen gas, and thus the oxygen concentration in the atmosphere is lowered. Hence, the oxygen concentration in the atmosphere can be lowered without provision of members such as the shielding member arranged above the substrate. Thus, it is possible to downsize the chamber.

The substrate processing method includes a first dissolved oxygen concentration adjustment step of lowering the dissolved oxygen concentration of the etching liquid within a first tank to a first dissolved oxygen concentration by reducing the dissolved oxygen in the etching liquid, and a second dissolved oxygen concentration adjustment step of lowering the dissolved oxygen concentration of the etching liquid within a second tank to a second dissolved oxygen concentration different from the first dissolved oxygen concentration by reducing the dissolved oxygen in the etching liquid, and the etching step includes a selection step of selecting, among the first tank and the second tank, a tank that stores the etching liquid having the dissolved oxygen concentration closer to the setting dissolved oxygen concentration determined in the first oxygen concentration determination step or the second oxygen concentration determination step and a liquid discharge step of discharging the etching liquid within the tank selected in the selection step toward the main surface of the substrate held horizontally.

In this method, the etching liquids having different dissolved oxygen concentrations are stored in the first tank and the second tank. The determined setting dissolved oxygen concentration is compared with a first dissolved oxygen concentration which indicates the dissolved oxygen concentration of the etching liquid within the first tank and a second dissolved oxygen concentration which indicates the dissolved oxygen concentration of the etching liquid within the second tank. When the first dissolved oxygen concentration is equal or close to the determined setting dissolved oxygen concentration, the etching liquid within the first tank is supplied to the main surface of the substrate. On the other hand, when the second dissolved oxygen concentration is equal or close to the determined setting dissolved oxygen concentration, the etching liquid within the second tank is supplied to the main surface of the substrate.

It is difficult to change immediately the dissolved oxygen concentration of the etching liquid. Hence, when the dissolved oxygen concentration of the etching liquid within the same tank is changed, a certain amount of time is needed. By contrast, when the etching liquids having different dissolved oxygen concentrations are previously stored in the first tank and the second tank, the dissolved oxygen concentration of the etching liquid to be supplied to the main surface of the substrate can be changed immediately. Thus, it is possible to reduce the downtime (time during which the substrate processing cannot be executed) of the substrate processing apparatus, and thus it is possible to reduce the amount of decrease in the throughput (the number of substrates processed per unit time) of the substrate processing apparatus.

The etching step is a step of etching a polysilicon film formed on the main surface of the substrate by supplying the entire region of the main surface of the substrate held horizontally with the etching liquid whose dissolved oxygen is reduced such that the dissolved oxygen concentration of the etching liquid is equal or approached to the setting dissolved oxygen concentration determined in the first oxygen concentration determination step or the second oxygen concentration determination step while causing the low oxygen gas that has flowed into the chamber in the low oxygen gas supply step to be in contact with the etching liquid held on the main surface of the substrate.

In this method, the etching liquid having a low dissolved oxygen concentration is supplied to the main surface of the substrate on which the polysilicon film is exposed in the state where the oxygen concentration in the atmosphere is lowered. Thus, it is possible to etch the polysilicon film formed on the main surface of the substrate while controlling the amount of oxygen dissolved into the etching liquid held on the substrate. The polysilicon film is an example of a thin film which is affected by the dissolved oxygen concentration of the etching liquid. Hence, not only the setting dissolved oxygen concentration and the setting atmosphere oxygen concentration but also the difference therebetween is controlled, and thus it is possible to etch the polysilicon film while controlling the distribution of the amount of etching.

Another preferred embodiment of the present invention provides a substrate processing apparatus including a substrate holding unit which holds a substrate horizontally, an etching liquid supply unit which supplies a main surface of the substrate held by the substrate holding unit with an etching liquid whose dissolved oxygen is reduced, a chamber which houses the substrate held by the substrate holding unit, a low oxygen gas supply unit which causes a low oxygen gas having an oxygen concentration lower than an oxygen concentration of air to flow into the chamber housing the substrate so as to adjust an oxygen concentration in an atmosphere in contact with the etching liquid held on the main surface of the substrate, a dissolved oxygen concentration change unit which changes a dissolved oxygen concentration of the etching liquid to be supplied to the substrate from the etching liquid supply unit, an atmosphere oxygen concentration change unit which changes the oxygen concentration in the atmosphere to be adjusted by the low oxygen gas supply unit, and a controller.

The controller executes a first oxygen concentration determination step of determining one of a setting dissolved oxygen concentration which indicates a setting value of the dissolved oxygen concentration of the etching liquid and a setting atmosphere oxygen concentration which indicates a setting value of the oxygen concentration in the atmosphere in contact with the etching liquid held on the main surface of the substrate, based on a required etching amount which indicates a required value of an amount of etching of the main surface of the substrate, a second oxygen concentration determination step of determining the other of the setting dissolved oxygen concentration and the setting atmosphere oxygen concentration based on the required etching amount and the one of the setting dissolved oxygen concentration and the setting atmosphere oxygen concentration determined in the first oxygen concentration determination step, a low oxygen gas supply step of causing the low oxygen gas, whose oxygen concentration is lower than an oxygen concentration of air and equal or approached to the setting atmosphere oxygen concentration determined in the first oxygen concentration determination step or the second oxygen concentration determination step, to flow into the chamber that houses the substrate, and an etching step of etching the main surface of the substrate by supplying an entire region of the main surface of the substrate held horizontally with the etching liquid whose dissolved oxygen is reduced such that the dissolved oxygen concentration of the etching liquid is equal or approached to the setting dissolved oxygen concentration determined in the first oxygen concentration determination step or the second oxygen concentration determination step, while causing the low oxygen gas that has flowed into the chamber in the low oxygen gas supply step to be in contact with the etching liquid held on the main surface of the substrate. According to this arrangement, the same effects as the effects described above regarding the substrate processing method can be obtained.

In the preferred embodiment, at least one of the following features may be added to the substrate processing apparatus.

One of the first oxygen concentration determination step and the second oxygen concentration determination step includes either a step of determining, as the setting dissolved oxygen concentration, a value larger than a minimum value in a range of values which can be set as the setting dissolved oxygen concentration or a step of determining, as the setting atmosphere oxygen concentration, a value larger than a minimum value in a range of values which can be set as the setting atmosphere oxygen concentration. According to this arrangement, the same effects as the effects described above regarding the substrate processing method can be obtained.

The etching liquid supply unit includes a liquid discharge port which discharges the etching liquid toward the main surface of the substrate held by the substrate holding unit, and the etching step includes a liquid discharge step of causing the liquid discharge port to discharge the etching liquid, whose dissolved oxygen is reduced such that the dissolved oxygen concentration of the etching liquid is equal or approached to the setting dissolved oxygen concentration determined in the first oxygen concentration determination step or the second oxygen concentration determination step, toward the main surface of the substrate held horizontally, while locating a landing position of the etching liquid, where the etching liquid discharged from the liquid discharge port first contacts the main surface of the substrate, in a central portion of the main surface of the substrate after start of the discharge of the etching liquid until stop of the discharge of the etching liquid. According to this arrangement, the same effects as the effects described above regarding the substrate processing method can be obtained.

The second oxygen concentration determination step is a step of determining, based on the required etching amount and the one of the setting dissolved oxygen concentration and the setting atmosphere oxygen concentration determined in the first oxygen concentration determination step, the other of the setting dissolved oxygen concentration and the setting atmosphere oxygen concentration such that the distribution of the amount of etching over the main surface of the substrate is formed in the shape of a cone or an inverted cone. According to this arrangement, the same effects as the effects described above regarding the substrate processing method can be obtained.

The first oxygen concentration determination step is a step of determining the setting dissolved oxygen concentration based on the required etching amount, and the second oxygen concentration determination step is a step of determining the setting atmosphere oxygen concentration based on the required etching amount and the setting dissolved oxygen concentration determined in the first oxygen concentration determination step. According to this arrangement, the same effects as the effects described above regarding the substrate processing method can be obtained.

The substrate processing apparatus further includes an opposed member which includes an opposed member which is movable within the chamber and which includes an opposed surface that faces the main surface of the substrate held by the substrate holding unit and an opening provided in the opposed surface, and the low oxygen gas supply step includes a step of causing the low oxygen gas to flow from the opening provided in the opposed surface to a space between the main surface of the substrate and the opposed surface of the opposed member, while causing the opposed surface of the opposed member which is movable within the chamber to face the main surface of the substrate. According to this arrangement, the same effects as the effects described above regarding the substrate processing method can be obtained.

The opening of the opposed member includes a central opening that is provided in the opposed surface of the opposed member and faces a central portion of the main surface of the substrate and an outer opening that is provided in the opposed surface of the opposed member and faces a portion of the main surface of the substrate other than the central portion of the main surface of the substrate, and the low oxygen gas supply step includes a step of causing the low oxygen gas to flow from the central opening to the space between the main surface of the substrate and the opposed surface of the opposed member and a step of causing the low oxygen gas to flow from the outer opening to the space between the main surface of the substrate and the opposed surface of the opposed member. According to this arrangement, the same effects as the effects described above regarding the substrate processing method can be obtained.

The low oxygen gas supply unit includes a fan unit which causes the low oxygen gas to flow from an upper end portion of the chamber into the chamber and an exhaust duct which causes a gas within the chamber to flow out from a lower end portion of the chamber, and the low oxygen gas supply step includes a step of causing the low oxygen gas to flow from the upper end portion of the chamber into the chamber while causing the gas within the chamber to flow out from the lower end portion of the chamber. According to this arrangement, the same effects as the effects described above regarding the substrate processing method can be obtained.

The etching liquid supply unit includes a first tank which stores the etching liquid, a second tank which stores the etching liquid, a first dissolved oxygen concentration change unit which lowers the dissolved oxygen concentration of the etching liquid within the first tank and a second dissolved oxygen concentration change unit which lowers the dissolved oxygen concentration of the etching liquid within the second tank, the controller further executes a first dissolved oxygen concentration adjustment step of lowering the dissolved oxygen concentration of the etching liquid within the first tank to the first dissolved oxygen concentration by reducing the dissolved oxygen in the etching liquid and a second dissolved oxygen concentration adjustment step of lowering the dissolved oxygen concentration of the etching liquid within a second tank to the second dissolved oxygen concentration different from the first dissolved oxygen concentration by reducing the dissolved oxygen in the etching liquid and the etching step includes a selection step of selecting, among the first tank and the second tank, a tank that stores the etching liquid having the dissolved oxygen concentration closer to the setting dissolved oxygen concentration determined in the first oxygen concentration determination step or the second oxygen concentration determination step and a liquid discharge step of discharging the etching liquid within the tank selected in the selection step toward the main surface of the substrate held horizontally. According to this arrangement, the same effects as the effects described above regarding the substrate processing method can be obtained.

The etching step is a step of etching a polysilicon film formed on the main surface of the substrate by supplying the entire region of the main surface held horizontally with the etching liquid whose dissolved oxygen is reduced such that the dissolved oxygen concentration of the etching liquid is equal or approached to the setting dissolved oxygen concentration determined in the first oxygen concentration determination step or the second oxygen concentration determination step while causing the low oxygen gas that has flowed into the chamber in the low oxygen gas supply step to be in contact with the etching liquid held on the main surface of the substrate. According to this arrangement, the same effects as the effects described above regarding the substrate processing method can be obtained.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 7A to 7D are conceptual diagrams showing the distribution of an etching rate when an etching liquid is supplied to the upper surface of the substrate on which a polysilicon film is exposed so as to etch the polysilicon film.

DETAILED DESCRIPTION OF PREFERRED EMBODIMENTS

Figure 1:
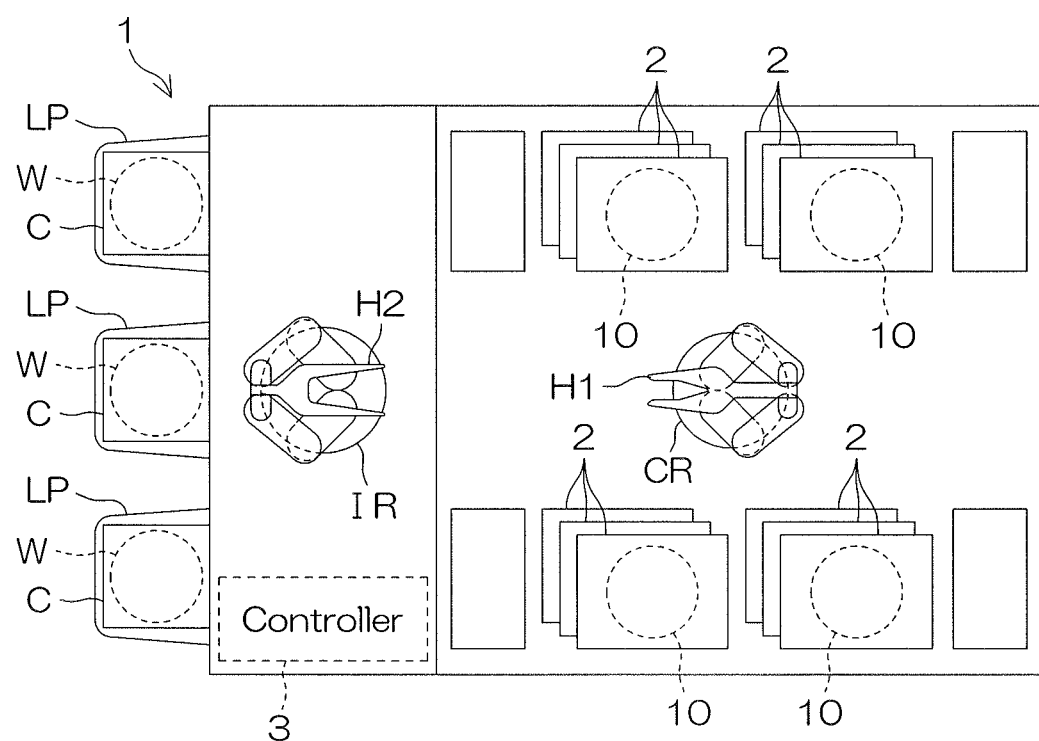
FIG. 1 is a schematic view of a substrate processing apparatus according to a first preferred embodiment of the present invention viewed from above.

FIG. 1 is a schematic view of a substrate processing apparatus 1 according to a first preferred embodiment of the present invention viewed from above.

The substrate processing apparatus 1 is a single substrate processing-type apparatus which processes disc-shaped substrates W such as a semiconductor wafer one by one. The substrate processing apparatus 1 includes load ports LP which hold carriers C that house one or more substrates W constituting one lot, a plurality of processing units 2 which process the substrates W transferred from the carriers C on the load ports LP with a processing fluid such as a processing liquid or a processing gas, transfer robots which transfer the substrates W between the carriers C on the load ports LP and the processing units 2 and a controller 3 which controls the substrate processing apparatus 1.

The transfer robots include an indexer robot IR which carries the substrates W into and out from the carriers C on the load ports LP and a center robot CR which carries the substrates W into and out from the processing units 2. The indexer robot IR transfers the substrates W between the load ports LP and the center robot CR, the center robot CR transfers the substrates W between the indexer robot IR and the processing units 2. The center robot CR and the indexer robot IR include hands H1 and H2 which support the substrates W, respectively.

Figure 2:
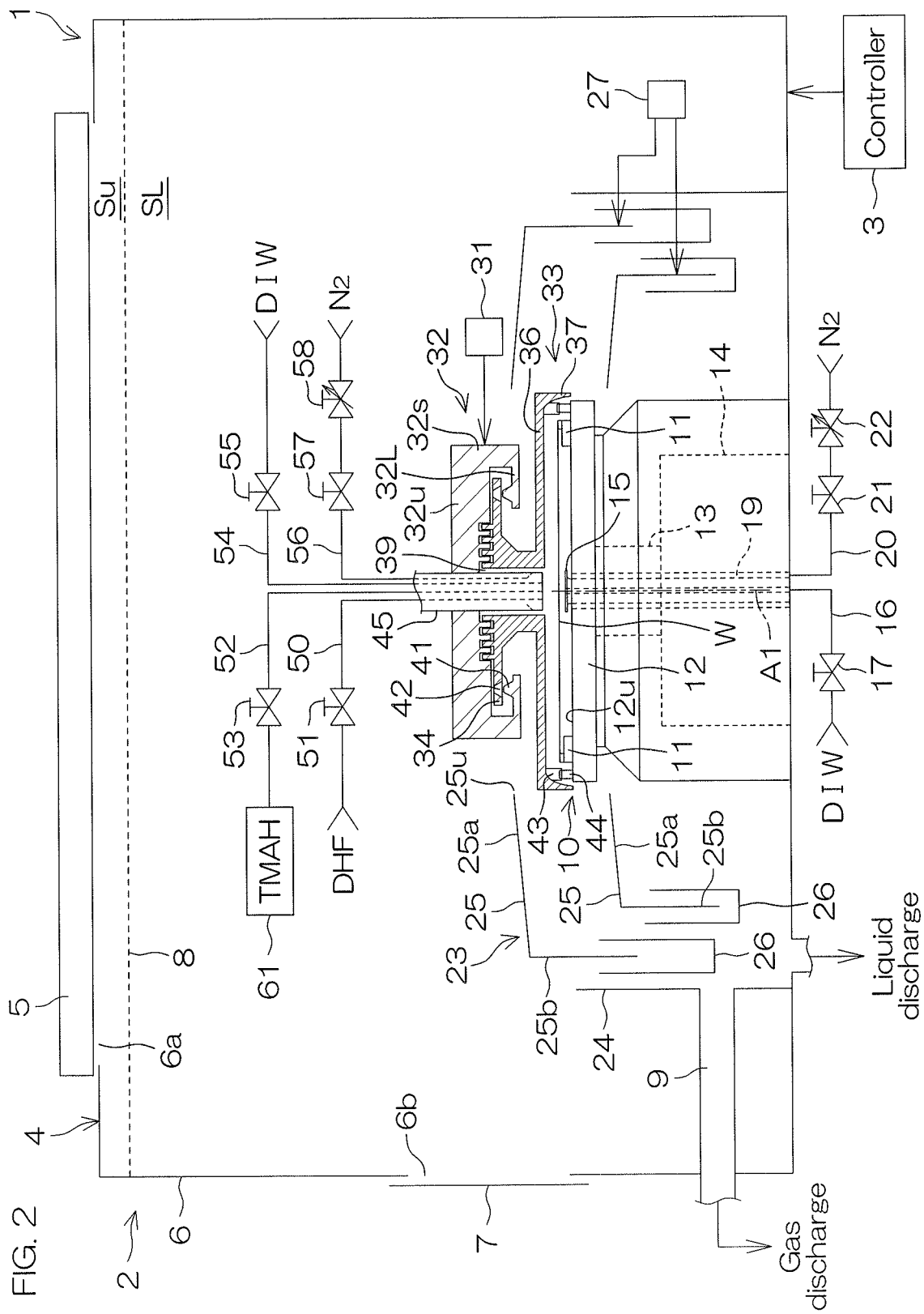
FIG. 2 is a schematic view of the interior of a processing unit included in the substrate processing apparatus when the interior is viewed horizontally.
Figure 3:
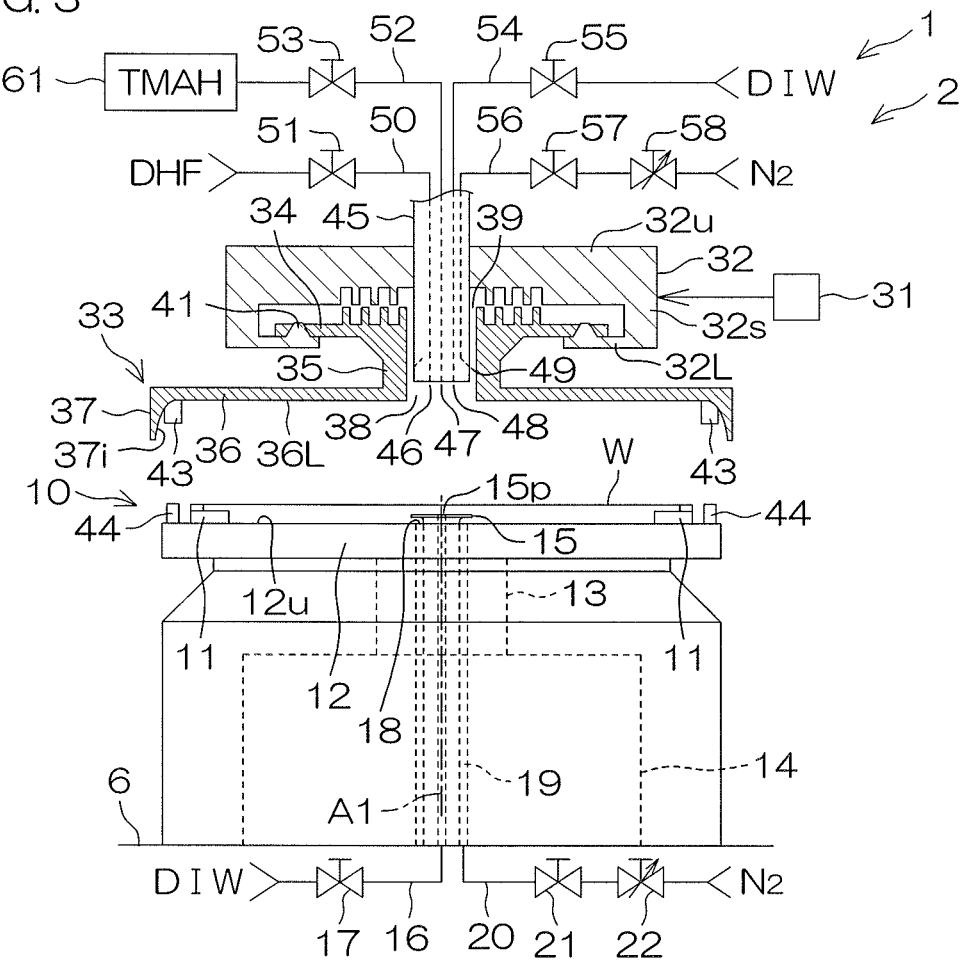
FIG. 3 is a partially enlarged view of FIG. 2.

FIG. 2 is a schematic view of the interior of the processing unit 2 included in the substrate processing apparatus 1 when the interior is viewed horizontally. FIG. 3 is a partially enlarged view of FIG. 2. FIG. 2 shows a state where a raising/lowering frame 32 and a shielding member 33 are positioned in a lower position, and FIG. 3 shows a state where the raising/lowering frame 32 and the shielding member 33 are positioned in an upper position.

The processing unit 2 includes a box-shaped chamber 4 which has an internal space, a spin chuck 10 which rotates one substrate W around a vertical rotation axis A1 passing through the central portion of the substrate W while holding the substrate W horizontally within the chamber 4 and a tubular processing cup 23 which surrounds the spin chuck 10 around the rotation axis A1.

The chamber 4 includes a box-shaped partition wall 6 provided with a carry-in/carry-out port 6b through which the substrate W passes, and a shutter 7 which opens and closes the carry-in/carry-out port 6b. The chamber 4 further includes a rectifying plate 8 which is arranged below an air outlet 6a that is open in the ceiling surface of the partition wall 6. An FFU 5 (fan filter unit) which feeds clean air (air filtered by a filter) is arranged on the air outlet 6a. An exhaust duct 9 which discharges a gas within the chamber 4 is connected to the processing cup 23. The air outlet 6a is provided in an upper end portion of the chamber 4, and the exhaust duct 9 is arranged in a lower end portion of the chamber 4. A portion of the exhaust duct 9 is arranged outside the chamber 4.

The rectifying plate 8 partitions the internal space of the partition wall 6 into an upper space Su above the rectifying plate 8 and a lower space SL below the rectifying plate 8. The upper space Su between the ceiling surface of the partition wall 6 and the upper surface of the rectifying plate 8 is a diffusion space in which the clean air diffuses. The lower space SL between the lower surface of the rectifying plate 8 and the floor surface of the partition wall 6 is a processing space in which the substrate W is processed. The spin chuck 10 and the processing cup 23 are arranged in the lower space SL. A distance in a vertical direction from the floor surface of the partition wall 6 to the lower surface of the rectifying plate 8 is longer than a distance in the vertical direction from the upper surface of the rectifying plate 8 to the ceiling surface of the partition wall 6.

The FFU 5 feeds the clean air via the air outlet 6a to the upper space Su. The clean air supplied to the upper space Su hits the rectifying plate 8 and diffuses in the upper space Su. The clean air within the upper space Su passes through a plurality of through holes which vertically penetrate the rectifying plate 8, and flows downward from the entire region of the rectifying plate 8. The clean air supplied to the lower space SL is sucked into the processing cup 23 and is discharged through the exhaust duct 9 from the lower end portion of the chamber 4. Thus, a uniform downward flow (down flow) of the clean air which flows downward from the rectifying plate 8 is formed in the lower space SL. The processing of the substrate W is performed in a state where the downward flow of the clean air is formed.

The spin chuck 10 includes a disc-shaped spin base 12 which is held by a horizontal posture, a plurality of chuck pins 11 which hold the substrate W in the horizontal posture above the spin base 12, a spin shaft 13 which extends downward from the central portion of the spin base 12 and a spin motor 14 which rotates the spin shaft 13 so as to rotate the spin base 12 and the chuck pins 11. The spin chuck 10 is not limited to a clamping type chuck which brings the chuck pins 11 into contact with the outer circumferential surface of the substrate W, and the spin chuck 10 may be a vacuum-type chuck which sucks the rear surface (lower surface) of the substrate W that is a non-device formation surface to the upper surface 12u of the spin base 12 so as to hold the substrate W horizontally.

The spin base 12 includes the upper surface 12u which is arranged below the substrate W. The upper surface 12u of the spin base 12 is parallel to the lower surface of the substrate W. The upper surface 12u of the spin base 12 is an opposed surface which faces the lower surface of the substrate W. The upper surface 12u of the spin base 12 has a circular ring shaped configuration which surrounds the rotation axis A1. The outside diameter of the upper surface 12u of the spin base 12 is larger than that of the substrate W. The chuck pins 11 protrude upward from the outer circumferential portion of the upper surface 12u of the spin base 12. The chuck pins 11 are held on the spin base 12. The substrate W is held on the chuck pins 11 in a state where the lower surface of the substrate W is separated from the upper surface 12u of the spin base 12.

The processing unit 2 includes a lower surface nozzle 15 which discharges the processing liquid toward the central portion of the lower surface of the substrate W. The lower surface nozzle 15 includes a nozzle disc portion which is arranged between the upper surface 12u of the spin base 12 and the lower surface of the substrate W and a nozzle tubular portion which extends downward from the nozzle disc portion. The liquid discharge port 15p of the lower surface nozzle 15 is open in the central portion of the upper surface of the nozzle disc portion. In a state where the substrate W is held on the spin chuck 10, the liquid discharge port 15p of the lower surface nozzle 15 faces the central portion of the lower surface of the substrate W.

The substrate processing apparatus 1 includes a lower rinse liquid piping 16 which guides a rinse liquid to the lower surface nozzle 15 and a lower rinse liquid valve 17 which is interposed in the lower rinse liquid piping 16. When the lower rinse liquid valve 17 is opened, the rinse liquid guided by the lower rinse liquid piping 16 is discharged upward from the lower surface nozzle 15 and supplied to the central portion of the lower surface of the substrate W. The rinse liquid supplied to the lower surface nozzle 15 is pure water (DIW: deionized water). The rinse liquid supplied to the lower surface nozzle 15 is not limited to pure water, and may be any one of IPA (isopropyl alcohol), carbonated water, electrolytic ion water, hydrogen water, ozone water and a hydrochloric acid water of a dilute concentration (for example, about 1 to 100 ppm).

Although not shown, the lower rinse liquid valve 17 includes a valve body provided with an internal flow path where the liquid flows and an annular valve seat surrounding the internal flow path, a valve member which is movable with respect to the valve seat and an actuator which moves the valve member between a closed position where the valve member contacts the valve seat and an opened position where the valve member is separated from the valve seat. The same applies to other valves. The actuator may be a pneumatic actuator or an electric actuator or an actuator other than those. The controller 3 controls the actuator so as to open and close the lower rinse liquid valve 17.

The outer circumferential surface of the lower surface nozzle 15 and the inner circumferential surface of the spin base 12 defines a lower tubular path 19 which extends vertically. The lower tubular path 19 includes a lower central opening 18 which is open in the central portion of the upper surface 12u of the spin base 12. The lower central opening 18 is arranged below the nozzle disc portion of the lower surface nozzle 15. The substrate processing apparatus 1 includes a lower gas piping 20 which guides an inert gas supplied via the lower tubular path 19 to the lower central opening 18, a lower gas valve 21 which is interposed in the lower gas piping 20 and a lower gas flow rate adjusting valve 22 which changes the flow rate of the inert gas supplied from the lower gas piping 20 to the lower tubular path 19.

The inert gas supplied from the lower gas piping 20 to the lower tubular path 19 is nitrogen gas. The inert gas is not limited to nitrogen gas, and may be another inert gas such as helium gas or argon gas. These inert gases are low oxygen gases which have an oxygen concentration lower than an oxygen concentration (about 21 vol %) in air.

When the lower gas valve 21 is opened, the nitrogen gas supplied from the lower gas piping 20 to the lower tubular path 19 is discharged upward from the lower central opening 18 at a flow rate corresponding to the degree of opening of the lower gas flow rate adjusting valve 22. Thereafter, the nitrogen gas flows radially in all directions between the lower surface of the substrate W and the upper surface 12u of the spin base 12. Thus, the space between the substrate W and the spin base 12 is filled with the nitrogen gas, and thus an oxygen concentration in an atmosphere is reduced. The oxygen concentration in the space between the substrate W and the spin base 12 is changed according to the degree of opening of the lower gas valve 21 and the lower gas flow rate adjusting valve 22.

The processing cup 23 includes a plurality of guards 25 which receive the liquid discharged outward from the substrate W, a plurality of cups 26 which receive the liquid guided downward by the guards 25 and a cylindrical outer wall member 24 which surrounds the guards 25 and the cups 26. FIG. 2 shows an example where two guards 25 and two cups 26 are provided.

The guard 25 includes a cylindrical guard tubular portion 25b which surrounds the spin chuck 10 and an annular guard ceiling portion 25a which extends obliquely upward from the upper end portion of the guard tubular portion 25b toward the rotation axis A1. Guard ceiling portions 25a vertically overlap each other, and guard tubular portions 25b are arranged concentrically. The cups 26 are arranged below the guard tubular portions 25b, respectively. The cup 26 defines an annular liquid receiving groove which is open upward.

The processing unit 2 includes a guard raising/lowering unit 27 which individually raises and lowers the guards 25. The guard raising/lowering unit 27 locates the guard 25 in an arbitrary position from an upper position to a lower position. The upper position is the position in which the upper end 25u of the guard 25 is arranged higher than a holding position in which the substrate W held by the spin chuck 10 is arranged. The lower position is the position in which the upper end 25u of the guard 25 is arranged lower than the holding position. The annular upper end of the guard ceiling portion 25a corresponds to the upper end 25u of the guard 25. The upper end 25u of the guard 25 surrounds the substrate W and the spin base 12 in plan view.

When the processing liquid is supplied to the substrate W in a state where the spin chuck 10 rotates the substrate W, the processing liquid supplied to the substrate W is spun off around the substrate W. When the processing liquid is supplied to the substrate W, at least one of the upper ends 25u of the guards 25 is arranged higher than the substrate W. Hence, the processing liquid such as the chemical liquid or the rinse liquid which is discharged around the substrate W is received by any one of the guards 25 and guided to the cup 26 corresponding to this guard 25.

As shown in FIG. 3, the processing unit 2 includes the raising/lowering frame 32 which is arranged above the spin chuck 10, the shielding member 33 which is suspended from the raising/lowering frame 32, a center nozzle 45 which is inserted into the shielding member 33 and a shielding member raising/lowering unit 31 which raises and lowers the raising/lowering frame 32 so as to raise and lower the shielding member 33 and the center nozzle 45. The raising/lowering frame 32, the shielding member 33 and the center nozzle 45 are arranged below the rectifying plate 8.

The shielding member 33 includes a disc portion 36 which is arranged above the spin chuck 10 and a tubular portion 37 which extends downward from the outer circumferential portion of the disc portion 36. The shielding member 33 includes an inner surface which has a cup-shaped configuration that is concave upward. The inner surface of the shielding member 33 includes a lower surface 36L of the disc portion 36 and the inner circumferential surface 37i of the tubular portion 37. In the following description, the lower surface 36L of the disc portion 36 may also be referred to as the lower surface 36L of the shielding member 33.

The lower surface 36L of the disc portion 36 is an opposed surface which faces the upper surface of the substrate W. The lower surface 36L of the disc portion 36 is parallel to the upper surface of the substrate W. The inner circumferential surface 37i of the tubular portion 37 extends downward from the outer circumferential edge of the lower surface 36L of the lower surface 36L. The inside diameter of the tubular portion 37 is increased as the lower end of the inner circumferential surface 37i is approached. The inside diameter of the lower end of the inner circumferential surface 37i of the tubular portion 37 is larger than the diameter of the substrate W. The inside diameter of the lower end of the inner circumferential surface 37i of the tubular portion 37 may be larger than the outside diameter of the spin base 12. When the shielding member 33 is arranged in the lower position (position shown in FIG. 2) which will be described below, the substrate W is surrounded by the inner circumferential surface 37i of the tubular portion 37.

The lower surface 36L of the disc portion 36 has a circular ring shaped configuration which surrounds the rotation axis A1. The inner circumferential edge of the lower surface 36L of the disc portion 36 defines an upper central opening 38 which is open in the central portion of the lower surface 36L of the disc portion 36. The inner circumferential surface of the shielding member 33 defines a through hole which extends upward from the upper central opening 38. The through hole of the shielding member 33 vertically penetrates the shielding member 33. The center nozzle 45 is inserted into the through hole of the shielding member 33. The outside diameter of the lower end of the center nozzle 45 is smaller than the diameter of the upper central opening 38.

The inner circumferential surface of the shielding member 33 is coaxial with the outer circumferential surface of the center nozzle 45. The inner circumferential surface of the shielding member 33 surrounds the outer circumferential surface of the center nozzle 45 across an interval in a radial direction (direction orthogonal to the rotation axis A1). The inner circumferential surface of the shielding member 33 and the outer circumferential surface of the center nozzle 45 define an upper tubular path 39 which extends vertically. The center nozzle 45 protrudes upward from the raising/lowering frame 32 and the shielding member 33. When the shielding member 33 is suspended from the raising/lowering frame 32, the lower end of the center nozzle 45 is arranged higher than the lower surface 36L of the disc portion 36. The processing liquid such as the chemical liquid or the rinse liquid is discharged downward from the lower end of the center nozzle 45.

The shielding member 33 includes a tubular connection portion 35 which extends upward from the disc portion 36, and an annular flange portion 34 which extends outward from the upper end portion of the connection portion 35. The flange portion 34 is arranged higher than the disc portion 36 and the tubular portion 37 of the shielding member 33. The flange portion 34 is parallel to the disc portion 36. The outside diameter of the flange portion 34 is smaller than that of the tubular portion 37. The flange portion 34 is supported on the lower plate 32L of the raising/lowering frame 32 which will be described below.

The raising/lowering frame 32 includes an upper plate 32u which is positioned higher than the flange portion 34 of the shielding member 33, a side ring 32s which extends downward from the upper plate 32u and surrounds the flange portion 34, and an annular lower plate 32L which extends inward from the lower end portion of the side ring 32s and is located below the flange portion 34 of the shielding member 33. The outer circumferential portion of the flange portion 34 is arranged between the upper plate 32u and the lower plate 32L. The outer circumferential portion of the flange portion 34 is movable vertically in a space between the upper plate 32u and the lower plate 32L.

The raising/lowering frame 32 and the shielding member 33 include locating protrusions 41 and locating holes 42 which restrict the relative movement of the raising/lowering frame 32 and the shielding member 33 in a circumferential direction (direction around the rotation axis A1) in a state where the shielding member 33 is supported by the raising/lowering frame 32. FIG. 2 shows an example where a plurality of locating protrusions 41 are provided on the lower plate 32L and where a plurality of locating holes 42 are provided in the flange portion 34. The locating protrusions 41 may be provided on the flange portion 34, and the locating holes 42 may be provided in the lower plate 32L.

The locating protrusions 41 are arranged on a circle which has a center arranged on the rotation axis A1. Similarly, the locating holes 42 are arranged on a circle which has a center arranged on the rotation axis A1. The locating holes 42 are arranged in the circumferential direction with the same regularity as the locating protrusions 41. The locating protrusions 41 which protrude upward from the upper surface of the lower plate 32L are inserted into the locating holes 42 which extend upward from the lower surface of the flange portion 34. Thus, the movement of the shielding member 33 in the circumferential direction with respect to the raising/lowering frame 32 is restricted.

The shielding member 33 includes a plurality of upper support portions 43 which protrude downward from the inner surface of the shielding member 33. The spin chuck 10 includes a plurality of lower support portions 44 which supports the upper support portions 43, respectively. The upper support portions 43 are surrounded by the tubular portion 37 of the shielding member 33. The lower ends of the upper support portions 43 are arranged higher than the lower end of the tubular portion 37. The distance in the radial direction from the rotation axis A1 to the upper support portion 43 is larger than the radius of the substrate W. Similarly, the distance in the radial direction from the rotation axis A1 to the lower support portion 44 is larger than the radius of the substrate W. The lower support portions 44 protrude upward from the upper surface 12u of the spin base 12. The lower support portions 44 are arranged on the outer side with respect to the chuck pins 11.

The upper support portions 43 are arranged on a circle which has a center arranged on the rotation axis A1. Similarly, the lower support portions 44 are arranged on a circle which has a center arranged on the rotation axis A1. The lower support portions 44 are arranged in the circumferential direction with the same regularity as the upper support portions 43. The lower support portions 44 are rotated together with the spin base 12 around the rotation axis A1. The rotational angle of the spin base 12 is changed by the spin motor 14. When the spin base 12 is arranged at a reference rotational angle, the upper support portions 43 respectively overlap the lower support portions 44 in plan view.

The shielding member raising/lowering unit 31 is coupled to the raising/lowering frame 32. When the shielding member raising/lowering unit 31 lowers the raising/lowering frame 32 in a state where the flange portion 34 of the shielding member 33 is supported on the lower plate 32L of the raising/lowering frame 32, the shielding member 33 is also lowered. When the shielding member raising/lowering unit 31 lowers the shielding member 33 in a state where the spin base 12 is arranged at such a reference rotational angle that the upper support portions 43 respectively overlap the lower support portions 44 in plan view, the lower end portions of the upper support portions contact the upper end portions of the lower support portions 44. Thus, the upper support portions 43 are respectively supported on the lower support portions 44.

When the shielding member raising/lowering unit 31 lowers the raising/lowering frame 32 after the upper support portions 43 of the shielding member 33 contact the lower support portions 44 of the spin chuck 10, the lower plate 32L of the raising/lowering frame 32 is moved downward with respect to the flange portion 34 of the shielding member 33. Thus, the lower plate 32L is separated from the flange portion 34, and thus the locating protrusions 41 are removed from the locating holes 42. Furthermore, the raising/lowering frame 32 and the center nozzle 45 are moved downward with respect to the shielding member 33, and thus the difference in height between the lower end of the center nozzle 45 and the lower surface 36L of the disc portion 36 of the shielding member 33 is reduced. Here, the raising/lowering frame 32 is arranged at such a height (the lower position which will be described below) that the flange portion 34 of the shielding member 33 does not contact the upper plate 32u of the raising/lowering frame 32.

The shielding member raising/lowering unit 31 locates the raising/lowering frame 32 in an arbitrary position from the upper position (position shown in FIG. 3) to the lower position (position shown in FIG. 2). The upper position is the position in which the locating protrusions 41 are inserted into the locating holes 42 and in which the flange portion 34 of the shielding member 33 contact the lower plate 32L of the raising/lowering frame 32. In other words, the upper position is the position in which the shielding member 33 is suspended from the raising/lowering frame 32. The lower position is the position in which the lower plate 32L is separated from the flange portion 34 and in which the locating protrusions 41 are removed from the locating holes 42. In other words, the lower position is the position in which the coupling of the raising/lowering frame 32 and the shielding member 33 is released and in which the shielding member 33 does not contact any portion of the raising/lowering frame 32.

When the raising/lowering frame 32 and the shielding member 33 are moved to the lower position, the lower ends of the tubular portion 37 of the shielding member 33 are arranged lower than the lower surface of the substrate W, and thus the space between the upper surface of the substrate W and the lower surface 36L of the shielding member 33 is surrounded by the tubular portion 37 of the shielding member 33. Hence, the space between the upper surface of the substrate W and the lower surface 36L of the shielding member 33 is shielded not only from an atmosphere above the shielding member 33 but also from an atmosphere around the shielding member 33. Thus, it is possible to enhance the sealing performance to seal the space between the upper surface of the substrate W and the lower surface 36L of the shielding member 33.

Furthermore, when the raising/lowering frame 32 and the shielding member 33 are arranged in the lower position, even if the shielding member 33 is rotated around the rotation axis A1, the shielding member 33 is prevented from colliding with the raising/lowering frame 32. When the upper support portions 43 of the shielding member 33 are supported on the lower support portions 44 of the spin chuck 10, the upper support portions 43 and the lower support portions 44 engage with each other, and thus the relative movement of the upper support portions 43 and the lower support portions 44 in the circumferential direction is prevented. When the spin motor 14 rotates in this state, the torque of the spin motor 14 is transmitted to the shielding member 33 via the upper support portions 43 and the lower support portions 44. Thus, the shielding member 33 rotates in the same direction and at the same speed as the spin base 12 in a state where the raising/lowering frame 32 and the center nozzle 45 are stationary.

The center nozzle 45 includes a plurality of liquid discharge ports through which the liquid is discharged and a gas discharge port through which the gas is discharged. The liquid discharge ports include a first chemical liquid discharge port 46 through which a first chemical liquid is discharged, a second chemical liquid discharge port 47 through which a second chemical liquid is discharged and an upper rinse liquid discharge port 48 through which the rinse liquid is discharged. The gas discharge port is an upper gas discharge port 49 through which an inert gas is discharged. The first chemical liquid discharge port 46, the second chemical liquid discharge port 47, the upper rinse liquid discharge port 48 are open in the lower end of the center nozzle 45. The upper gas discharge port 49 is open in the outer circumferential surface of the center nozzle 45.

Each of the first chemical liquid and the second chemical liquid is a liquid which contains at least one of sulfuric acid, nitric acid, hydrochloric acid, hydrofluoric acid, phosphoric acid, acetic acid, ammonia water, hydrogen peroxide water, organic acids (for example, citric acid, oxalic acid), organic alkalis (for example, TMAH: tetramethylammonium hydroxide), inorganic alkalis (for example, NaOH: sodium hydroxide), a surfactant and a corrosion inhibitor, for example. Sulfuric acid, nitric acid, hydrochloric acid, hydrofluoric acid, phosphoric acid, acetic acid, ammonia water, hydrogen peroxide water, citric acid, oxalic acid, inorganic alkalis and TMAH are etching liquids.

The first chemical liquid and the second chemical liquid may be the same types of chemical liquid or may be different types of chemical liquids. FIG. 2, etc., show an example where the first chemical liquid is DHF (dilute hydrofluoric acid) and where the second chemical liquid is TMAH. Also, FIG. 2, etc., show the example where the rinse liquid supplied to the center nozzle 45 is pure water and where the inert gas supplied to the center nozzle 45 is nitrogen gas. The rinse liquid supplied to the center nozzle 45 may be a rinse liquid other than pure water. The inert gas supplied to the center nozzle 45 may be an inert gas other than nitrogen gas.

The substrate processing apparatus 1 includes a first chemical liquid piping 50 which guides the first chemical liquid to the center nozzle 45, a first chemical liquid valve 51 which is interposed in the first chemical liquid piping 50, a second chemical liquid piping 52 which guides the second chemical liquid to the center nozzle 45, a second chemical liquid valve 53 which is interposed in the second chemical liquid piping 52, an upper rinse liquid piping 54 which guides the rinse liquid to the center nozzle 45 and an upper rinse liquid valve 55 which is interposed in the upper rinse liquid piping 54. The substrate processing apparatus 1 further includes an upper gas piping 56 which guides the gas to the center nozzle 45, an upper gas valve 57 which is interposed in the upper gas piping 56 and an upper gas flow rate adjusting valve 58 which changes the flow rate of the gas supplied from the upper gas piping 56 to the center nozzle 45.

When the first chemical liquid valve 51 is opened, the first chemical liquid is supplied to the center nozzle 45 and is discharged downward from the first chemical liquid discharge port 46 which is open in the lower end of the center nozzle 45. The substrate processing apparatus 1 includes a chemical liquid producing unit 61 which produces the second chemical liquid. When the second chemical liquid valve 53 is opened, the second chemical liquid produced in the chemical liquid producing unit 61 is supplied to the center nozzle 45 and is discharged downward from the second chemical liquid discharge port 47 which is open in the lower end of the center nozzle 45. When the upper rinse liquid valve 55 is opened, the rinse liquid is supplied to the center nozzle 45 and is discharged downward from the upper rinse liquid discharge port 48 which is open in the lower end of the center nozzle 45. Thus, the chemical liquid or the rinse liquid is supplied to the upper surface of the substrate W.

When the upper gas valve 57 is opened, the nitrogen gas guided by the upper gas piping 56 is supplied to the center nozzle 45 at a flow rate corresponding to the degree of opening of the upper gas flow rate adjusting valve 58 and is discharged obliquely downward from the upper gas discharge port 49 which is open in the outer circumferential surface of the center nozzle 45. Thereafter, the nitrogen gas flows downward within the upper tubular path 39 while flowing in the circumferential direction within the upper tubular path 39. The nitrogen gas that has reached the lower end of the upper tubular path 39 flows downward from the lower end of the upper tubular path 39. Thereafter, the nitrogen gas flows radially in all directions in the space between the upper surface of the substrate W and the lower surface 36L of the shielding member 33. Thus, the space between the substrate W and the shielding member 33 is filled with the nitrogen gas, and the oxygen concentration in the atmosphere is reduced. The oxygen concentration in the space between the substrate W and the shielding member 33 is changed according to the degree of opening of the upper gas valve 57 and the upper gas flow rate adjusting valve 58.

Figure 4:
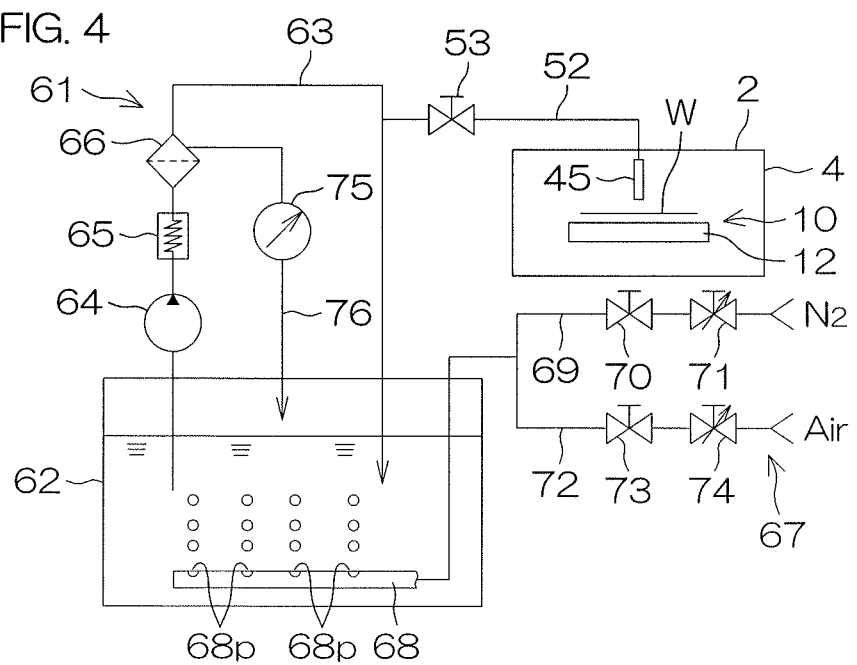
FIG. 4 is a schematic view showing a chemical liquid producing unit which produces a chemical liquid to be supplied to a substrate and a dissolved oxygen concentration change unit which adjusts the dissolved oxygen concentration of the chemical liquid.

FIG. 4 is a schematic view showing the chemical liquid producing unit 61 which produces the chemical liquid to be supplied to the substrate W and a dissolved oxygen concentration change unit 67 which adjusts the dissolved oxygen concentration of the chemical liquid.

The chemical liquid producing unit 61 includes a tank 62 in which the chemical liquid supplied to the substrate W is stored and a circulation piping 63 which defines an annular circulation path that circulates the chemical liquid within the tank 62. The chemical liquid producing unit 61 further includes a pump 64 which feeds the chemical liquid within the tank 62 to the circulation piping 63 and a filter 66 which removes foreign matter such as particles from the chemical liquid flowing though the circulation path. In addition thereto, the chemical liquid producing unit 61 may include a temperature adjuster 65 which changes the temperature of the chemical liquid within the tank 62 by heating or cooling the chemical liquid.

The upstream end and the downstream end of the circulation piping 63 are connected to the tank 62. The upstream end of the second chemical liquid piping 52 is connected to the circulation piping 63 and the downstream end of the second chemical liquid piping 52 is connected to the center nozzle 45. The pump 64, the temperature adjuster 65 and the filter 66 are interposed in the circulation piping 63. The temperature adjuster 65 may be a heater which heats the liquid at a temperature higher than the room temperature (for example, 20 to 30° C.), may be a cooler which cools the liquid at a temperature lower than the room temperature or may have both functions of heating and cooling.

The pump 64 constantly feeds the chemical liquid within the tank 62 into the circulation piping 63. The chemical liquid is fed from the tank 62 to the upstream end of the circulation piping 63 and is returned from the downstream end of the circulation piping 63 to the tank 62. Thus, the chemical liquid within the tank 62 is circulated along the circulation path. While the chemical liquid is being circulated along the circulation path, the temperature of the chemical liquid is adjusted by the temperature adjuster 65. Thus, the chemical liquid within the tank 62 is maintained at a constant temperature. When the second chemical liquid valve 53 is opened, some of the chemical liquid flowing within the circulation piping 63 is supplied via the second chemical liquid piping 52 to the center nozzle 45.

The substrate processing apparatus 1 includes the dissolved oxygen concentration change unit 67 which adjusts the dissolved oxygen concentration of the chemical liquid. The dissolved oxygen concentration change unit 67 includes a gas supply piping 68 which supplies the gas into the tank 62 so as to dissolve the gas into the chemical liquid within the tank 62. The dissolved oxygen concentration change unit 67 further includes an inert gas piping 69 which supplies the inert gas to the gas supply piping 68, an inert gas valve 70 which is opened and closed between an opened state where the inert gas flows from the inert gas piping 69 to the gas supply piping 68 and a closed state where the inert gas is stopped at the inert gas piping 69 and an inert gas flow rate adjusting valve 71 which changes the flow rate of the inert gas supplied from the inert gas piping 69 to the gas supply piping 68.

The gas supply piping 68 is a bubbling piping which includes gas discharge ports 68p which are arranged in the chemical liquid within the tank 62. When the inert gas valve 70 is opened, that is, when the inert gas valve 70 is switched from the closed state to the opened state, the inert gas such as nitrogen gas is discharged from the gas discharge ports 68p at a flow rate corresponding to the degree of opening of the inert gas flow rate adjusting valve 71. Thus, a large number of air bubbles are formed in the chemical liquid within the tank 62, and thus the inert gas is dissolved in the chemical liquid within the tank 62. Here, the dissolved oxygen is discharged from the chemical liquid, and thus the dissolved oxygen concentration of the chemical liquid is lowered. The dissolved oxygen concentration of the chemical liquid within the tank 62 is changed by changing the flow rate of the nitrogen gas discharged from the gas discharge ports 68p.

The dissolved oxygen concentration change unit 67 may include, in addition to the inert gas piping 69, etc., an oxygen containing gas piping 72 which supplies an oxygen containing gas containing oxygen such as clean air to the gas supply piping 68, an oxygen containing gas valve 73 which is opened and closed between an opened state where the oxygen containing gas flows from the oxygen containing gas piping 72 to the gas supply piping 68 and a closed state where the oxygen containing gas is stopped at the oxygen containing gas piping 72 and an oxygen containing gas flow rate adjusting valve 74 which changes the flow rate of the oxygen containing gas supplied from the oxygen containing gas piping 72 to the gas supply piping 68.

When the oxygen containing gas valve 73 is opened, air which is an example of the oxygen containing gas is discharged from the gas discharge ports 68p at a flow rate corresponding to the degree of opening of the oxygen containing gas flow rate adjusting valve 74. Thus, a large number of air bubbles are formed in the chemical liquid within the tank 62, and thus the air is dissolved in the chemical liquid within the tank 62. Air contains oxygen at about 21% of the volume, whereas the nitrogen does not contain oxygen or contains only a very small amount of oxygen. Hence, as compared with a case where the air is not supplied into the tank 62, it is possible to increase the dissolved oxygen concentration of the chemical liquid within the tank 62 in a short period of time. For example, when the dissolved oxygen concentration of the chemical liquid is excessively lowered with respect to a setting value, the air may be intentionally dissolved into the chemical liquid within the tank 62.

The dissolved oxygen concentration change unit 67 may further include an oxygen meter 75 which measures the dissolved oxygen concentration of the chemical liquid. FIG. 4 shows an example where the oxygen meter 75 is interposed in a measurement piping 76. The oxygen meter 75 may be interposed in the circulation piping 63. The upstream end of the measurement piping 76 is connected to the filter 66, and the downstream end of the measurement piping 76 is connected to the tank 62. The upstream end of the measurement piping 76 may be connected to the circulation piping 63. Some of the chemical liquid within the circulation piping 63 flows into the measurement piping 76 and is returned to the tank 62. The oxygen meter 75 measures the dissolved oxygen concentration of the chemical liquid which flows into the measurement piping 76. The degree of opening of at least one of the inert gas valve 70, the inert gas flow rate adjusting valve 71, the oxygen containing gas valve 73 and the oxygen containing gas flow rate adjusting valve 74 is changed according to the measurement value of the oxygen meter 75.

Figure 5:
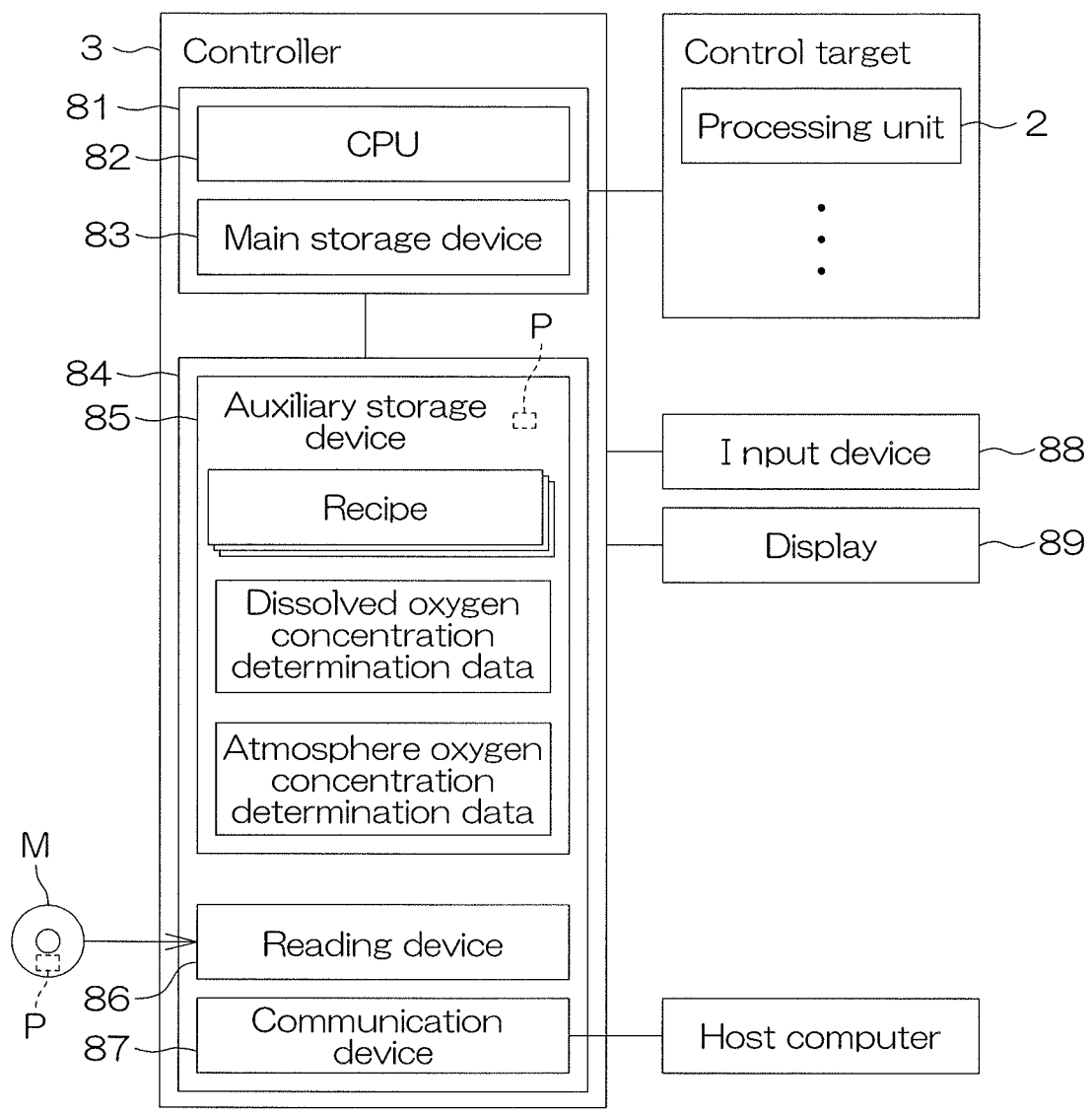
FIG. 5 is a block diagram showing the hardware of a controller.

FIG. 5 is a block diagram showing the hardware of the controller 3.

The controller 3 is a computer which includes a computer main body 81 and a peripheral device 84 which is connected to the computer main body 81. The computer main body 81 includes a CPU 82 (central processing unit) which executes various types of commands and a main storage device 83 which stores information. The peripheral device 84 includes an auxiliary storage device 85 which stores information such as a program P, a reading device 86 which reads information from a removable medium M and a communication device 87 which communicates with other devices such as a host computer.

The controller 3 is connected to an input device 88 and a display 89. The input device 88 is operated when an operator such as a user or a maintenance operator inputs information to the substrate processing apparatus 1. The information is displayed on the screen of the display 89. The input device 88 may be any one of a keyboard, a pointing device and a touch panel or may be a device other than those. A touch panel display which serves both as the input device 88 and the display 89 may be provided in the substrate processing apparatus 1.

The CPU 82 executes the program P stored in the auxiliary storage device 85. The program P within the auxiliary storage device 85 may be previously installed in the controller 3, may be fed through the reading device 86 from the removable medium M to the auxiliary storage device 85 or may be fed from an external device such as the host computer to the auxiliary storage device 85 through the communication device 87.

The auxiliary storage device 85 and the removable medium M are nonvolatile memories which retain memory even without power being supplied. The auxiliary storage device 85 is, for example, a magnetic storage device such as a hard disk drive. The removable medium M is, for example, an optical disc such as a compact disc or a semiconductor memory such as a memory card. The removable medium M is an example of a computer readable recording medium in which the program P is recorded.

The auxiliary storage device 85 stores a plurality of recipes. The auxiliary storage device 85 further stores dissolved oxygen concentration determination data and atmosphere oxygen concentration determination data which will be described below. The recipe is information which specifies the details of processing, processing conditions and processing procedures of the substrate W. A plurality of recipes differ from each other in at least one of the details of processing, the processing conditions and the processing procedures of the substrate W. The controller 3 controls the substrate processing apparatus 1 such that the substrate W is processed according to the recipe designated by the host computer. The controller 3 executes individual steps described below by controlling the substrate processing apparatus 1. In other words, the controller 3 is programmed to execute the individual steps described below.

Figure 6:
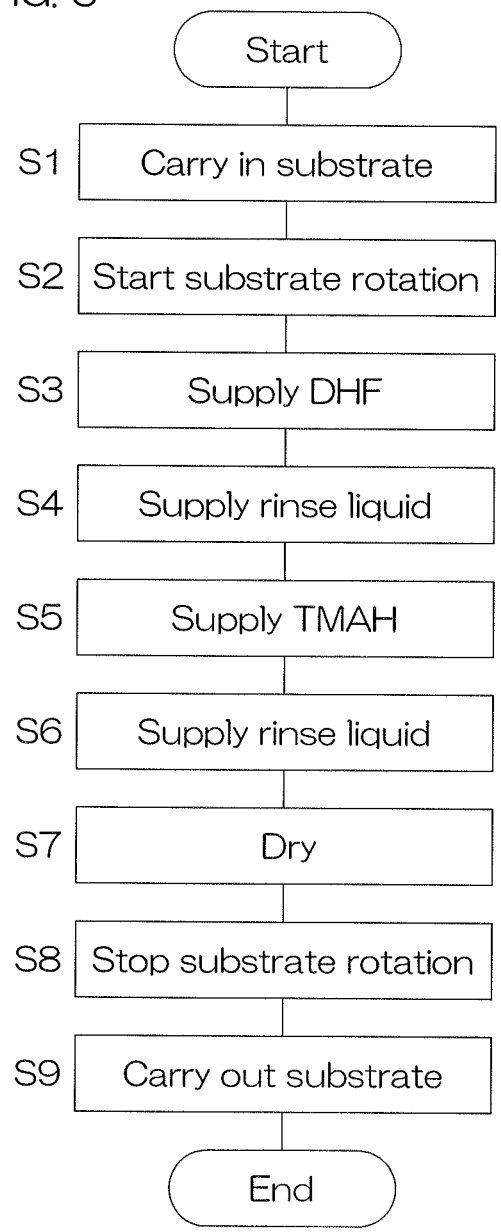
FIG. 6 is a process chart for describing an example of the processing of the substrate which is executed by the substrate processing apparatus.

FIG. 6 is a process chart for describing an example of the processing of the substrate W which is executed by the substrate processing apparatus 1. In the following description, FIGS. 1, 2, 3 and 6 are referenced.

A specific example of the processing of the substrate W is etching processing in which TMAH as an example of an etching liquid is supplied to the front surface of the substrate W (silicon wafer) on which a polysilicon film is exposed so as to etch the polysilicon film. A target to be etched may be a thin film other than the polysilicon film or the substrate W itself (silicon wafer). Processing other than the etching may be executed.

When the substrate W is processed by the substrate processing apparatus 1, a carry-in step of carrying the substrate W into the chamber 4 is performed (step S1 in FIG. 6).

Specifically, in a state where the raising/lowering frame 32 and the shielding member 33 are positioned in the upper position and where all the guards 25 are positioned in the lower position, the center robot CR causes the hand H1 to enter the chamber 4 while supporting the substrate W with the hand H1. Then, the center robot CR places, on the chuck pins 11, the substrate W on the hand H1 with the front surface of the substrate W directed upward. Thereafter, the chuck pins 11 are pressed onto the outer circumferential surface of the substrate W, and thus the substrate W is grasped. The center robot CR places the substrate W on the spin chuck 10 and thereafter retracts the hand H1 from the interior of the chamber 4.

Then, the upper gas valve 57 and the lower gas valve 21 are opened, and thus the upper central opening 38 of the shielding member 33 and the lower central opening 18 of the spin base 12 start the discharge of the nitrogen gas. Thus, the oxygen concentration in the atmosphere in contact with the substrate W is reduced. Furthermore, the shielding member raising/lowering unit 31 lowers the raising/lowering frame 32 from the upper position to the lower position, and the guard raising/lowering unit 27 raises any one of the guards 25 from the lower position to the upper position. Here, the spin base 12 is held at such a reference rotational angle where the upper support portions 43 respectively overlap the lower support portions 44 in plan view. Hence, the upper support portions 43 of the shielding member 33 are supported on the lower support portions 44 of the spin base 12, and the shielding member 33 is separated from the raising/lowering frame 32. Thereafter, the spin motor 14 is driven so as to start the rotation of the substrate W (step S2 in FIG. 6).

Then, a first chemical liquid supply step of supplying DHF as an example of the first chemical liquid to the upper surface of the substrate W is performed (step S3 in FIG. 6).

Specifically, in a state where the shielding member 33 is positioned in the lower position, the first chemical liquid valve 51 is opened, and thus the center nozzle 45 starts the discharge of the DHF. The DHF discharged from the center nozzle 45 lands on the central portion of the upper surface of the substrate W and thereafter flows outward along the upper surface of the substrate W which is being rotated. Thus, a liquid film of the DHF which covers the entire region of the upper surface of the substrate W is formed, and the DHF is supplied to the entire region of the upper surface of the substrate W. When a predetermined time elapses after the opening of the first chemical liquid valve 51, the first chemical liquid valve 51 is closed, and the discharge of the DHF is stopped.

Then, a first rinse liquid supply step of supplying pure water as an example of the rinse liquid to the upper surface of the substrate W is performed (step S4 in FIG. 6).

Specifically, in a state where the shielding member 33 is positioned in the lower position, the upper rinse liquid valve 55 is opened, and thus the center nozzle 45 starts the discharge of the pure water. The pure water which lands on the central portion of the upper surface of the substrate W flows outward along the upper surface of the substrate W that is being rotated. The DHF on the substrate W is rinsed off by the pure water discharged from the center nozzle 45. Thus, a liquid film of the pure water which covers the entire region of the upper surface of the substrate W is formed. When a predetermined time elapses after the opening of the upper rinse liquid valve 55, the upper rinse liquid valve 55 is closed, and the discharge of the pure water is stopped.

Then, a second chemical liquid supply step of supplying TMAH as an example of the second chemical liquid to the upper surface of the substrate W is performed (step S5 in FIG. 6).

Specifically, in a state where the shielding member 33 is positioned in the lower position, the second chemical liquid valve 53 is opened, and thus the center nozzle 45 starts the discharge of the TMAH. Before the start of the discharge of the TMAH, in order to switch the guards 25 which receive the liquid discharged from the substrate W, the guard raising/lowering unit 27 may vertically move at least one of the guards 25. The TMAH which lands on the central portion of the upper surface of the substrate W flows outward along the upper surface of the substrate W that is being rotated. The pure water on the substrate W is replaced by the TMAH discharged from the center nozzle 45. Thus, a liquid film of the TMAH which covers the entire region of the upper surface of the substrate W is formed. When a predetermined time elapses after the opening of the second chemical liquid valve 53, the second chemical liquid valve 53 is closed, and the discharge of the TMAH is stopped.

As described previously, the TMAH is the etching liquid which has a low dissolved oxygen concentration. The TMAH is supplied to the upper surface of the substrate W in a state where the oxygen concentration in the atmosphere is lowered. Hence, the TMAH flows outward along the upper surface of the substrate W while being in contact with the atmosphere in which the oxygen concentration is low. As will be described below, the setting value of the dissolved oxygen concentration of the TMAH supplied to the upper surface of the substrate W and the setting value of the oxygen concentration in the atmosphere in contact with the TMAH are related to each other in order to control the distribution of the amount of etching.

Then, a second rinse liquid supply step of supplying pure water as an example of the rinse liquid to the upper surface of the substrate W is performed (step S6 in FIG. 6).

Specifically, in the state where the shielding member 33 is positioned in the lower position, the upper rinse liquid valve 55 is opened, and thus the center nozzle 45 starts the discharge of the pure water. The pure water which lands on the central portion of the upper surface of the substrate W flows outward along the upper surface of the substrate W that is being rotated. The TMAH on the substrate W is rinsed off by the pure water discharged from the center nozzle 45. Thus, a liquid film of the pure water which covers the entire region of the upper surface of the substrate W is formed. When a predetermined time elapses after the opening of the upper rinse liquid valve 55, the upper rinse liquid valve 55 is closed, and the discharge of the pure water is stopped.

Then, a drying step of drying the substrate W by the rotation of the substrate W is performed (step S7 in FIG. 6).

Specifically, in the state where the shielding member 33 is positioned in the lower position, the spin motor 14 accelerates the substrate W in the rotation direction so as to rotate the substrate W at a high rotational speed (for example, several thousands of rpm) higher than the rotational speed of the substrate W in a period from the first chemical liquid supply step to the second rinse liquid supply step. Thus, the liquid is removed from the substrate W, and thus the substrate W is dried. When a predetermined time elapses after the start of the high-speed rotation of the substrate W, the spin motor 14 stops the rotation. Here, the spin motor 14 stops the spin base 12 at the reference rotational angle. Thus, the rotation of the substrate W is stopped (step S8 in FIG. 6).

Then, a carry-out step of carrying the substrate W out from the chamber 4 is performed (step S9 in FIG. 6).

Specifically, the shielding member raising/lowering unit 31 raises the raising/lowering frame 32 to the upper position, and the guard raising/lowering unit 27 lowers all the guards 25 to the lower position. Furthermore, the upper gas valve 57 and the lower gas valve 21 are closed, and thus the upper central opening 38 of the shielding member 33 and the lower central opening 18 of the spin base 12 stop the discharge of the nitrogen gas. Thereafter, the center robot CR causes the hand H1 to enter the chamber 4. After the chuck pins 11 release the grasping of the substrate W, the center robot CR supports the substrate W on the spin chuck 10 with the hand H1. Thereafter, the center robot CR retracts the hand H1 from the interior of the chamber 4 while supporting the substrate W with the hand H1. Thus, the processed substrate W is carried out from the chamber 4.

FIGS. 7A, 7B, 7C and 7D are conceptual diagrams showing the distribution of an etching rate when the etching liquid is supplied to the upper surface of the substrate W on which the polysilicon film is exposed so as to etch the polysilicon film in a case where the etching liquid is an organic alkali such as the TMAH.

FIGS. 7A to 7D show the distribution of the etching rate (the amount of etching per unit time) in the upper surface of the substrate W on a straight line which passes through the center of the upper surface of the substrate W and two points positioned on the outer circumferential edge of the upper surface of the substrate W. The etching rate corresponds to an etching speed. In the following description, a reference line (vertical axis shown in FIGS. 7A to 7D) means a straight line which passes through the center of the upper surface of the substrate W and which is orthogonal to the upper surface of the substrate W.

In the wet etching of the polysilicon film using an organic alkali such as the TMAH as an example of the etching liquid, the dissolved oxygen of the etching liquid tends to prevent the etching of the polysilicon film. Hence, as the dissolved oxygen concentration of the etching liquid increases, the etching rate is lowered, whereas as the dissolved oxygen concentration of the etching liquid is lowered, the etching rate increases.

When the etching liquid is supplied to the substrate W in a state where the dissolved oxygen concentration of the etching liquid is low and the oxygen concentration in the atmosphere is high, the oxygen in the atmosphere is dissolved in the etching liquid flowing outward along the upper surface of the substrate W, and thus the dissolved oxygen concentration of the etching liquid increases as the outer circumference of the substrate W is approached. In other words, the dissolved oxygen concentration of the etching liquid in the outer circumferential portion of the upper surface of the substrate W is higher than the dissolved oxygen concentration of the etching liquid in the central portion of the upper surface of the substrate W. Hence, as shown in FIG. 7A, the etching rate shows the distribution of an inverted V-shape substantially symmetrical with respect to the reference line. In this case, the substrate W is etched such that the distribution of the amount of etching over the upper surface of the substrate W is formed in the shape of a cone.

As shown in FIG. 7B, when the etching liquid is supplied to the substrate W in a state where only the oxygen concentration in the atmosphere is lowered and conditions, such as the dissolved oxygen concentration of the etching liquid, other than the oxygen concentration in the atmosphere are not changed, the amount of oxygen dissolved in the etching liquid on the substrate W is reduced and thus an increase in the dissolved oxygen concentration of the etching liquid on the substrate W is reduced. Hence, as shown in FIG. 7B, although the etching rate in the central portion of the upper surface of the substrate W is hardly changed, the etching rate in the outer circumferential portion of the upper surface of the substrate W is increased as compared with the etching rate before the oxygen concentration in the atmosphere is lowered. Hence, a difference between the etching rate in the central portion of the upper surface of the substrate W and the etching rate in the outer circumferential portion of the upper surface of the substrate W is reduced, and thus the uniformity of the etching is enhanced.

FIG. 7C shows the distribution of the etching rate when the dissolved oxygen concentration of the etching liquid is increased with respect to processing conditions in which the distribution of the etching rate shown in FIG. 7B is obtained. The etching rate shown in FIG. 7C draws a gentle curve of an inverted V-shape. When the dissolved oxygen concentration of the etching liquid is increased, the etching rate in the central portion of the upper surface of the substrate W is lowered. Furthermore, since the oxygen concentration in the atmosphere is lowered, the dissolved oxygen concentration of the etching liquid on the substrate W is hardly increased. Hence, as shown in FIG. 7C, the distribution of the etching rate draws a substantially flat curve, and thus the uniformity of the etching is further enhanced. It is considered that the same results are obtained when, instead of increasing the dissolved oxygen concentration of the etching liquid, the oxygen concentration in the atmosphere is further lowered.

FIG. 7D shows the distribution of the etching rate when the dissolved oxygen concentration of the etching liquid is increased with respect to processing conditions in which the distribution of the etching rate shown in FIG. 7C is obtained. When the dissolved oxygen concentration of the etching liquid is increased, the etching rate in the central portion of the upper surface of the substrate W is lowered. On the other hand, since the oxygen concentration in the atmosphere is significantly lowered with respect to the dissolved oxygen concentration of the etching liquid, oxygen in the atmosphere is not dissolved in the etching liquid but nitrogen in the atmosphere is dissolved into the etching liquid on the substrate W, with the result that the dissolved oxygen concentration of the etching liquid is lowered. Hence, as shown in FIG. 7D, the distribution of the etching rate draws a V-shaped curve substantially symmetrical with respect to the reference line. In this case, the substrate W is etched such that the distribution of the amount of etching over the upper surface of the substrate W is formed in the shape of an inverted cone.

As described above, when the uniformity of the etching is enhanced, it is not necessarily preferable to minimize the oxygen concentration in the atmosphere but the oxygen concentration in the atmosphere needs to be set according to the dissolved oxygen concentration of the etching liquid supplied to the substrate W. Similarly, when the oxygen concentration in the atmosphere is constant, if the dissolved oxygen concentration of the etching liquid is excessively low or high, the uniformity of the etching is lowered. From a different viewpoint, the distribution of the etching rate over the entire region of the upper surface of the substrate W can be formed to be flat or can be formed in the shape of a cone or an inverted cone by relating the dissolved oxygen concentration of the etching liquid and the oxygen concentration in the atmosphere to each other.

Although in the above description, the case where the etching rate is lowered as the dissolved oxygen concentration of the etching liquid increases is described, the same tendency would apply to a case where the etching rate is reduced as the dissolved oxygen concentration of the etching liquid increases. Hence, it is not necessarily preferable to minimize both the dissolved oxygen concentration of the etching liquid and the oxygen concentration in the atmosphere, and in order to control the cross-sectional shape (profile) of the upper surface of the substrate W after the etching, it is important to control the difference between the dissolved oxygen concentration of the etching liquid and the oxygen concentration in the atmosphere.

When the upper surface of the substrate W before the etching is flat, the upper surface of the substrate W is etched such that the distribution of the etching rate is flat, and thus the upper surface of the substrate W after the etching is formed to be flat. When the upper surface of the substrate W before the etching is formed in the shape of a cone, the upper surface of the substrate W is etched such that the distribution of the amount of etching over the upper surface of the substrate W is formed in the shape of a cone, and thus it is possible to improve the flatness of the upper surface of the substrate W after the etching. Similarly, when the upper surface of the substrate W before the etching is formed in the shape of an inverted cone, the upper surface of the substrate W is etched such that the distribution of the amount of etching over the upper surface of the substrate W is formed in the shape of an inverted cone, and thus it is possible to improve the flatness of the upper surface of the substrate W after the etching.

The difference between the amount of etching in the central portion of the upper surface of the substrate W and the amount of etching in the outer circumferential portion of the upper surface of the substrate W depends not only on the dissolved oxygen concentration of the etching liquid and the oxygen concentration in the atmosphere but also on a plurality of conditions including the time of supply of the etching liquid, the flow rate of supply of the etching liquid (the supplied amount per unit time), the concentration of the etching liquid, the temperature of the etching liquid and the rotational speed of the substrate W. Hence, at least one of these conditions is changed, and thus it is possible to improve the flatness of the upper surface of the substrate W after the etching. Alternatively, the upper surface of the substrate W after the etching can be intentionally formed in the shape of a cone or an inverted cone.

Figure 8:
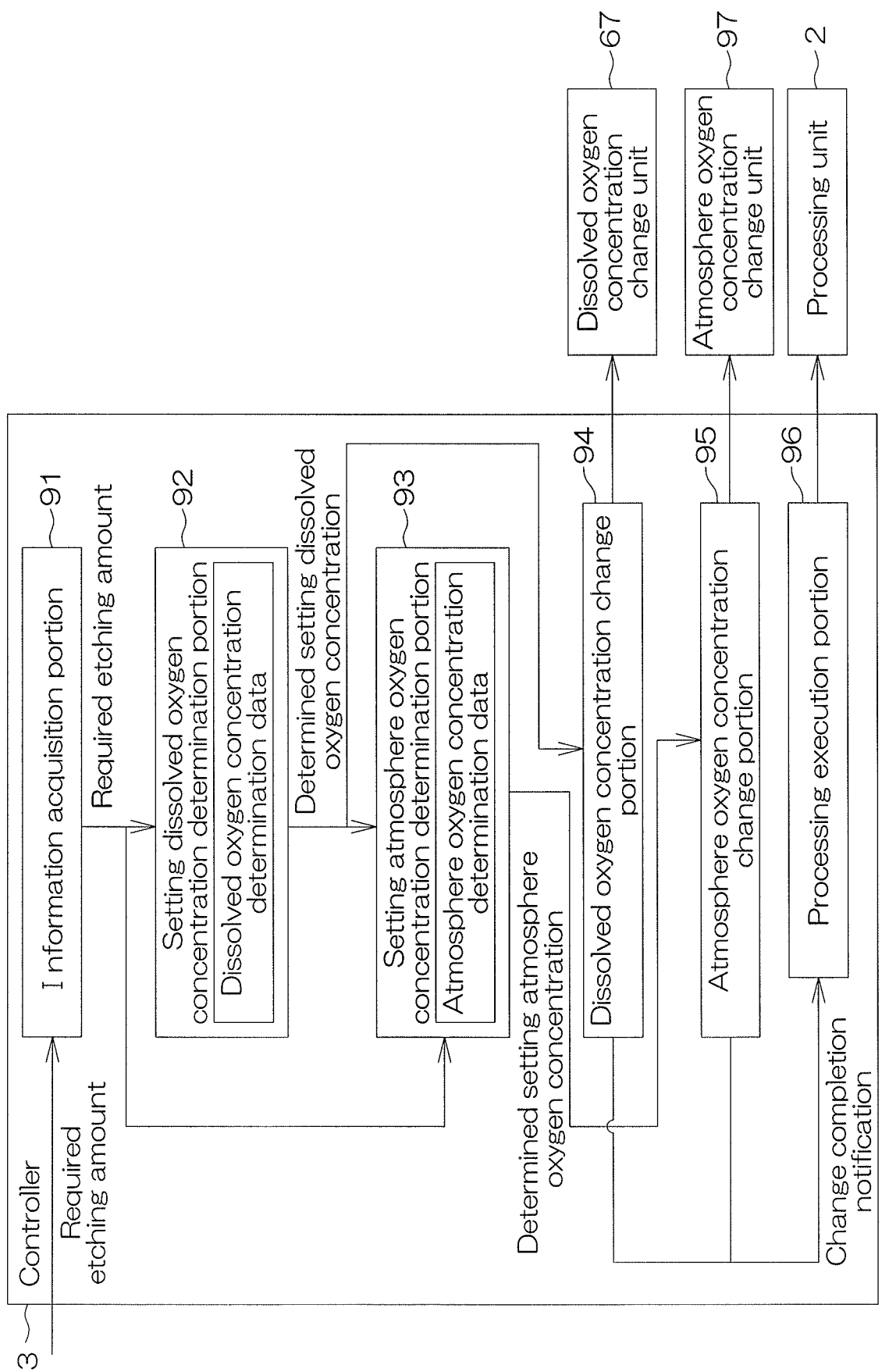
FIG. 8 is a block diagram showing the functional blocks of the controller.

FIG. 8 is a block diagram showing the functional blocks of the controller 3.

In the following description, FIGS. 5 and 8 will be referenced. An information acquisition portion 91, a setting dissolved oxygen concentration determination portion 92, a setting atmosphere oxygen concentration determination portion 93, a dissolved oxygen concentration change portion 94, an atmosphere oxygen concentration change portion 95 and a processing execution portion 96 are functional blocks which are realized by the execution of the program P installed in the controller 3 by the CPU 82. In the following description, a case where the conditions other than the dissolved oxygen concentration of the etching liquid and the oxygen concentration in the atmosphere are constant and where at least one of the dissolved oxygen concentration of the etching liquid and the oxygen concentration in the atmosphere is changed such that the distribution of the amount of etching on the substrate W is changed will be described.

As shown in FIG. 8, the controller 3 includes the information acquisition portion 91 which acquires information input to the substrate processing apparatus 1. The information acquired by the information acquisition portion 91 may be information that is input to the substrate processing apparatus 1 from the external device such as the host computer or may be information that is input to the substrate processing apparatus 1 via the input device 88 by the operator.

The information input to the information acquisition portion 91 includes a setting central etching amount which indicates the setting value of the amount of etching in the central portion of the upper surface of the substrate W and a setting outer circumference etching amount which indicates the setting value of the amount of etching in the outer circumferential portion of the upper surface of the substrate W. When the entire region of the upper surface of the substrate W is uniformly etched, instead of or in addition to the setting central etching amount and the setting outer circumference etching amount, the setting value of the amount of etching and the setting value of the uniformity of etching may be input to the information acquisition portion 91. The uniformity of etching is a value obtained by dividing a standard deviation by an average value. These pieces of information correspond to a required etching amount which indicates a required value of the amount of etching in the upper surface of the substrate W.

The controller 3 includes the setting dissolved oxygen concentration determination portion 92 which determines a setting dissolved oxygen concentration that indicates the setting value of the dissolved oxygen concentration of the etching liquid and the setting atmosphere oxygen concentration determination portion 93 which determines a setting atmosphere oxygen concentration that indicates the setting value of the oxygen concentration in the atmosphere. The setting dissolved oxygen concentration determination portion 92 stores dissolved oxygen concentration determination data which indicates a relationship between the etching rate in a landing position and the setting dissolved oxygen concentration. The setting atmosphere oxygen concentration determination portion 93 stores atmosphere oxygen concentration determination data which indicates a relationship between the gradient of the etching rate and a setting atmosphere oxygen concentration. The gradient of the etching rate means the gradient of a straight line which connects the etching rate in the landing position and an etching rate in an arbitrary position within the upper surface of the substrate W.

The dissolved oxygen concentration determination data is produced based on the measurement value of the etching rate in the landing position when the setting dissolved oxygen concentration is changed to a plurality of values without the conditions other than the setting dissolved oxygen concentration being changed. The dissolved oxygen concentration determination data may be a formula or a table which indicates a relationship between the etching rate in the landing position and the dissolved oxygen concentration or may be a form other than these. Similarly, the atmosphere oxygen concentration determination data is produced based on the measurement value of the gradient of the etching rate when the setting atmosphere oxygen concentration is changed to a plurality of values without the conditions other than the setting atmosphere oxygen concentration being changed. The atmosphere oxygen concentration determination data may be a formula or a table which indicates a relationship between the gradient of the etching rate and the setting atmosphere oxygen concentration or may be a form other than these.

When the conditions other than the dissolved oxygen concentration of the etching liquid and the oxygen concentration in the atmosphere are constant, the etching rate in the landing position mainly depends on the dissolved oxygen concentration of the etching liquid. In other words, when the dissolved oxygen concentration of the etching liquid is the same, even if the oxygen concentration in the atmosphere is changed, the etching rate in the landing position is not changed or is hardly changed. On the other hand, the gradient of the etching rate depends not only on the oxygen concentration in the atmosphere but also on the dissolved oxygen concentration of the etching liquid. In other words, even when the oxygen concentration in the atmosphere is the same, if the dissolved oxygen concentration of the etching liquid is changed, the gradient of the etching liquid can be changed.

When the conditions other than the dissolved oxygen concentration of the etching liquid and the oxygen concentration in the atmosphere are constant, if the etching rate in the landing position, the gradient of the etching rate, the time of supply of the etching liquid and the diameter of the substrate W are found, the estimation values of the amounts of etching in arbitrary positions within the upper surface of the substrate W including the central portion and the outer circumferential portions are found. In other words, when these are found, the estimation values of the distribution of the amount of etching within the upper surface of the substrate W including the estimation value of the amount of etching in the central portion of the upper surface of the substrate W and the estimation value of the amount of etching in the outer circumferential portion of the upper surface of the substrate W are found.

The setting dissolved oxygen concentration determination portion 92 uses the dissolved oxygen concentration determination data to calculate or search for the value of the setting dissolved oxygen concentration in which the estimation value of the amount of etching in the central portion of the upper surface of the substrate W corresponding to the landing position is equal to or substantially equal to the setting central etching amount, and determines, as the setting dissolved oxygen concentration, the value which is calculated or searched for. Similarly, the setting atmosphere oxygen concentration determination portion 93 uses the atmosphere oxygen concentration determination data to calculate or search for the value of the setting atmosphere oxygen concentration in which the estimation value of the amount of etching in the outer circumferential portion of the upper surface of the substrate W is equal to or substantially equal to the setting outer circumference etching amount, and determines, as the setting atmosphere oxygen concentration, the value which is calculated or searched for.

When the etching liquid is the TMAH and the target to be etched is the polysilicon film, the range of values which can be set as the setting dissolved oxygen concentration is, for example, 0.02 to 6.6 ppm (in a case where the processing is performed at 40° C.), and the range of values which can be set as the setting atmosphere oxygen concentration is, for example, 10 to 140000 ppm. The determined setting dissolved oxygen concentration may be the minimum value in the range of values described above or a value larger than the minimum value. The same applies to the determined setting atmosphere oxygen concentration. Although both the setting dissolved oxygen concentration and the setting atmosphere oxygen concentration can be the minimum values as a result, the setting dissolved oxygen concentration and the setting atmosphere oxygen concentration are determined based on the required etching amount.

The controller 3 includes the dissolved oxygen concentration change portion 94 which causes the dissolved oxygen concentration change unit 67 to change an actual dissolved oxygen concentration of the etching liquid such that the actual dissolved oxygen concentration of the etching liquid is equal or approached to the setting dissolved oxygen concentration determined by the setting dissolved oxygen concentration determination portion 92 and the atmosphere oxygen concentration change portion 95 causes an atmosphere oxygen concentration change unit 97 to change an actual oxygen concentration in the atmosphere such that the actual oxygen concentration in the atmosphere is equal or approached to the setting atmosphere oxygen concentration determined by the setting atmosphere oxygen concentration determination portion 93. The atmosphere oxygen concentration change unit 97 includes the lower gas valve 21, the lower gas flow rate adjusting valve 22, the upper gas valve 57 and the upper gas flow rate adjusting valve 58 (see FIGS. 2 and 3).

The dissolved oxygen concentration change portion 94 may change the dissolved oxygen concentration of the etching liquid which is specified in the recipe or may cause, before the recipe is executed, the dissolved oxygen concentration change unit 67 to change the actual dissolved oxygen concentration of the etching liquid. Similarly, the atmosphere oxygen concentration change portion 95 may change the oxygen concentration in the atmosphere which is specified in the recipe or may cause, before the recipe is executed, the atmosphere oxygen concentration change unit 97 to change the actual oxygen concentration in the atmosphere. When the recipe is changed, the recipe is executed so as to change the actual dissolved oxygen concentration or the actual atmosphere oxygen concentration.

The setting dissolved oxygen concentration and the setting atmosphere oxygen concentration may be changed for each of the substrates W, may be changed every plurality of substrates W or may be changed per given time. In other words, the same setting dissolved oxygen concentration and the same setting atmosphere oxygen concentration may be applied to a plurality of substrates W. In this case, the setting dissolved oxygen concentration and the setting atmosphere oxygen concentration may be changed for each of the lots of the substrates W or may be changed each time the processing conditions for the substrate W performed by a device other than the substrate processing apparatus 1 are changed.

The controller 3 includes the processing execution portion 96 which controls the substrate processing apparatus 1 so as to cause the substrate processing apparatus 1 to process the substrate W according to the recipe. When the change of the setting dissolved oxygen concentration and the setting atmosphere oxygen concentration is completed, the dissolved oxygen concentration change portion 94 and the atmosphere oxygen concentration change portion 95 notify the processing execution portion 96 of the completion of the change. Thereafter, the processing execution portion 96 causes the processing unit 2, etc., to execute the example of the processing shown in FIG. 6. Thus, in a state where the actual dissolved oxygen concentration of the etching liquid is substantially equal to the determined setting dissolved oxygen concentration and where the actual oxygen concentration in the atmosphere is substantially equal to the determined setting atmosphere oxygen concentration, the etching liquid is supplied to the upper surface of the substrate W.

As described above, in the first preferred embodiment, the etching liquid such as the TMAH having a low dissolved oxygen concentration is supplied to the upper surface of the substrate W in the state where the oxygen concentration in the atmosphere is lowered. Thus, it is possible to supply the etching liquid to the entire region of the upper surface of the substrate W while controlling the amount of oxygen dissolved into the etching liquid held on the substrate W. The actual dissolved oxygen concentration of the etching liquid supplied to the upper surface of the substrate W is equal or approached to the setting dissolved oxygen concentration. Similarly, the actual oxygen concentration in the atmosphere in contact with the etching liquid held on the upper surface of the substrate W is equal or approached to the setting atmosphere oxygen concentration.

The setting dissolved oxygen concentration and the setting atmosphere oxygen concentration are not set independently based on the required etching amount but are related to each other. Specifically, one of the setting dissolved oxygen concentration and the setting atmosphere oxygen concentration is determined based on the required etching amount. Then, based on the determined value (one of the setting dissolved oxygen concentration and the setting atmosphere oxygen concentration) and the required etching amount, the other of the setting dissolved oxygen concentration and the setting atmosphere oxygen concentration is determined. In other words, not only the setting dissolved oxygen concentration and the setting atmosphere oxygen concentration but also the difference between the setting dissolved oxygen concentration and the setting atmosphere oxygen concentration is controlled.

As described above, the setting dissolved oxygen concentration and the setting atmosphere oxygen concentration are lowered while controlling the difference between the setting dissolved oxygen concentration and the setting atmosphere oxygen concentration, and thus it is possible to change the distribution of the amount of etching over the upper surface of the substrate W without changing the landing position of the etching liquid with respect to the upper surface of the substrate W. For example, it is possible to uniformly etch the entire region of the upper surface of the substrate W with a constant amount of etching, and to etch the upper surface of the substrate W such that the distribution of the amount of etching over the upper surface of the substrate W is formed in the shape of a cone or an inverted cone. Thus, it is possible to etch the upper surface of the substrate W while controlling the distribution of the amount of etching.

In the first preferred embodiment, a value which is larger than the minimum value in the range of values that can be set as the setting dissolved oxygen concentration or the setting atmosphere oxygen concentration is set as the setting dissolved oxygen concentration or the setting atmosphere oxygen concentration. In other words, unlike the conventional method in which the setting dissolved oxygen concentration and the setting atmosphere oxygen concentration are set to values as small as possible, the setting dissolved oxygen concentration, the setting atmosphere oxygen concentration and the difference therebetween are controlled. Thus, it is possible to etch the upper surface of the substrate W while controlling the distribution of the amount of etching.

In the first preferred embodiment, the landing position of the etching liquid is positioned in the central portion of the upper surface of the substrate W after the start of the discharge until the stop of the discharge. In such a case as well, the difference between the setting dissolved oxygen concentration and the setting atmosphere oxygen concentration is controlled, and thus it is possible to control the distribution of the amount of etching. Hence, it is not necessary to move the landing position of the etching liquid with respect to the upper surface of the substrate W or to provide a plurality of liquid discharge ports which discharge the etching liquid toward the upper surface of the substrate W in order to control the distribution of the amount of etching.

In the first preferred embodiment, the setting dissolved oxygen concentration and the setting atmosphere oxygen concentration are set such that the distribution of the amount of etching over the upper surface of the substrate W is formed in the shape of a cone or an inverted cone. When the upper surface of the substrate W before the etching is in the shape of a cone, the upper surface of the substrate W is etched such that the distribution of the amount of etching over the upper surface of the substrate W is formed in the shape of a cone, and thus it is possible to improve the flatness of the upper surface of the substrate W after the etching. Similarly, when the upper surface of the substrate W before the etching is in the shape of an inverted cone, the upper surface of the substrate W is etched such that the distribution of the amount of etching over the upper surface of the substrate W is formed in the shape of an inverted cone, and thus it is possible to improve the flatness of the upper surface of the substrate W after the etching.

In the first preferred embodiment, after the setting dissolved oxygen concentration is determined, the setting atmosphere oxygen concentration is determined. The etching rate in the landing position depends on the dissolved oxygen concentration of the etching liquid. In other words, the setting atmosphere oxygen concentration does not significantly affect the etching rate in the landing position. Instead, the gradient of the etching rate, that is, the gradient of a straight line which connects the etching rate in the landing position and the etching rate in an arbitrary position within the upper surface of the substrate W depends on the dissolved oxygen concentration of the etching liquid and the oxygen concentration in the atmosphere. Hence, when the setting dissolved oxygen concentration is previously determined, the etching rate in the landing position and the gradient of the etching rate can be set relatively easily.

By contrast, when the setting atmosphere oxygen concentration is previously determined, the conditions other than the setting dissolved oxygen concentration and the setting atmosphere oxygen concentration may need to be changed. For example, when the setting atmosphere oxygen concentration is previously determined, in order to obtain the intended gradient of the etching rate, the setting dissolved oxygen concentration is significantly restricted. When the intended etching rate cannot be obtained by the determined setting dissolved oxygen concentration, another condition such as the time of supply of the etching liquid, the concentration thereof, etc., may need to be changed. Hence, the setting dissolved oxygen concentration is previously determined, and thus the etching rate in the landing position and the gradient of the etching rate can be set relatively easily.

In the first preferred embodiment, the nitrogen gas as an example of a low oxygen gas which has an oxygen concentration lower than the oxygen concentration in air flows out from the upper central opening 38 provided in the lower surface 36L of the shielding member 33 as an example of an opposed member and flows into the space between the upper surface of the substrate W and the lower surface 36L of the shielding member 33. Thus, the space between the substrate W and the shielding member 33 is filled with the nitrogen gas, and thus the oxygen concentration in the atmosphere is lowered. Hence, as compared with a case where the oxygen concentration is lowered in the entire internal space of the chamber 4, the used amount of nitrogen gas can be reduced, and thus it is possible to change the oxygen concentration in a short period of time.

In the first preferred embodiment, in the state where the oxygen concentration in the atmosphere is lowered, the etching liquid having a low dissolved oxygen concentration is supplied to the upper surface of the substrate W to which the polysilicon film is exposed. Thus, it is possible to etch the polysilicon film formed on the upper surface of the substrate W while controlling the amount of oxygen dissolved into the etching liquid held on the substrate W. The polysilicon film is an example of a thin film which is affected by the dissolved oxygen concentration of the etching liquid. Hence, not only the setting dissolved oxygen concentration and the setting atmosphere oxygen concentration but also the difference therebetween is controlled, and thus it is possible to etch the polysilicon film while controlling the distribution of the amount of etching.

Second Preferred Embodiment

A second preferred embodiment mainly differs from the first preferred embodiment in that the structure of the shielding member 33 is different and that a plurality of outer openings 101 which discharge a gas are provided in the lower surface 36L of the shielding member 33.

Figure 9:
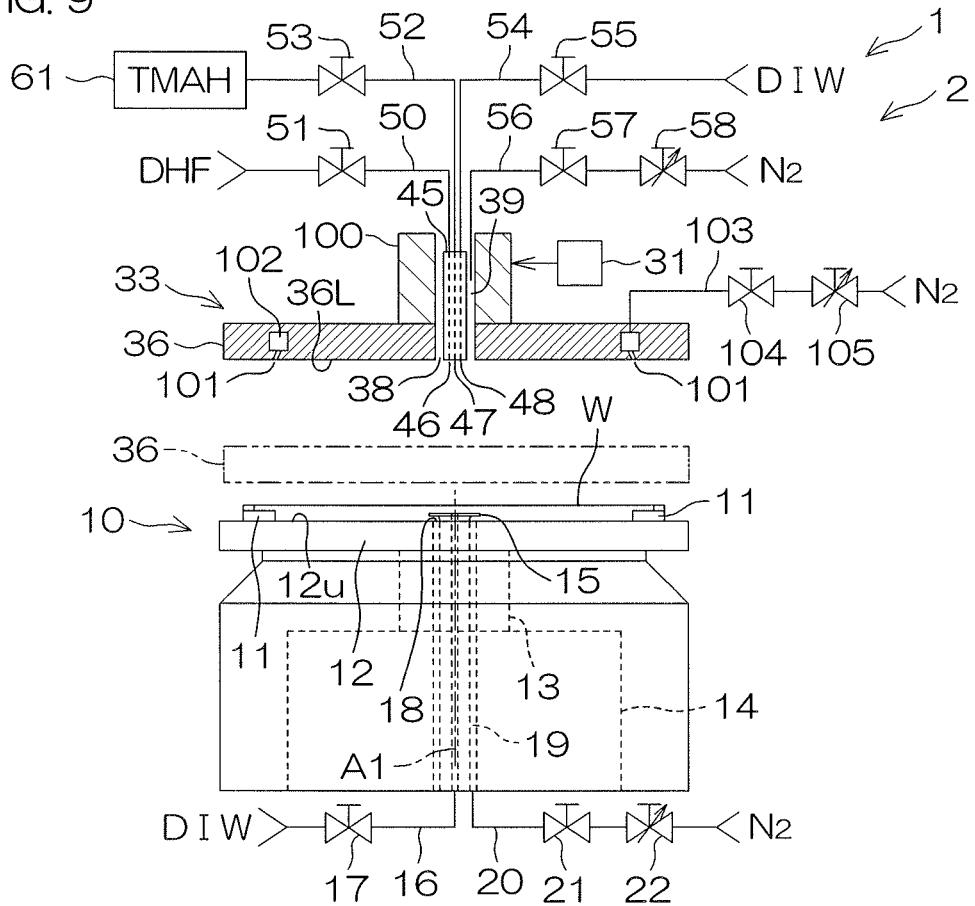
FIG. 9 is a schematic view showing a vertical cross section of a shielding member according to a second preferred embodiment of the present invention.
Figure 10:
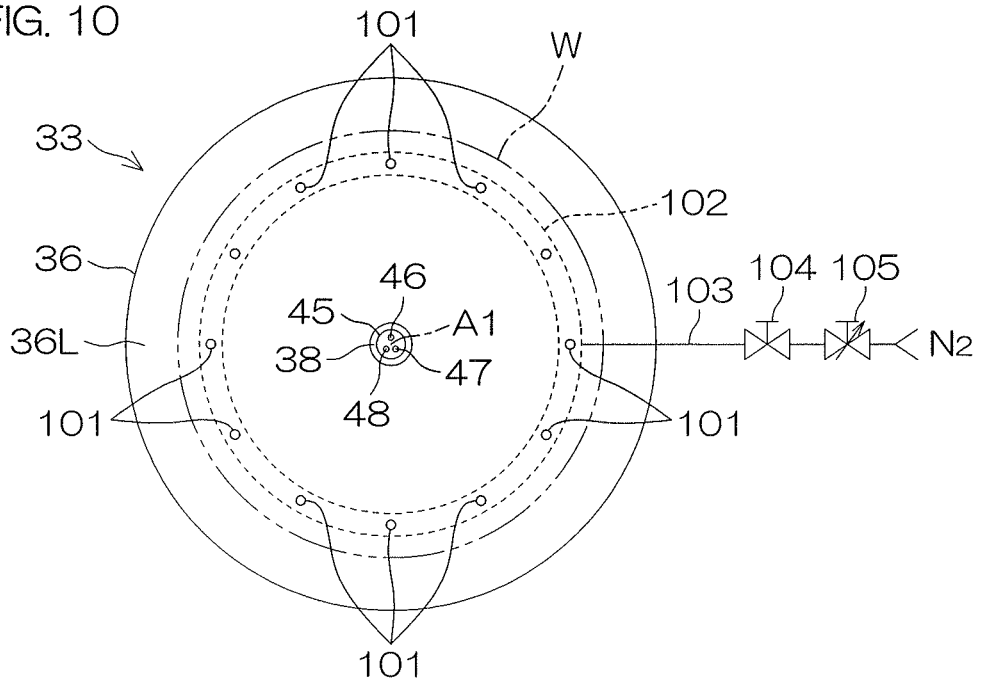
FIG. 10 is a schematic view showing the bottom surface of the shielding member according to the second preferred embodiment of the present invention.

FIG. 9 is a schematic view showing a vertical cross section of a shielding member 33 according to the second preferred embodiment of the present invention. FIG. 10 is a schematic view showing the bottom surface of the shielding member 33 according to the second preferred embodiment of the present invention. In FIG. 9 to FIG. 10, components equivalent to the above described components shown in FIG. 1 to FIG. 8 are designated by the same reference characters as in FIG. 1, etc., and description thereof is omitted.

As shown in FIG. 9, the shielding member 33 is arranged above a spin chuck 10. The shielding member 33 is a disc portion 36 which has an outside diameter larger than the diameter of the substrate W. In other words, the tubular portion 37 of the first preferred embodiment is not provided in the shielding member 33 of the second preferred embodiment. The shielding member 33 is held by a horizontal posture. The center line of the shielding member 33 is arranged on a rotation axis A1. The outside diameter of the lower surface 36L of the shielding member 33 is larger than that of the substrate W. The lower surface 36L of the shielding member 33 is parallel to the upper surface of the substrate W and faces the upper surface of the substrate W.

As shown in FIG. 10, the lower surface 36L of the shielding member 33 has a circular ring shaped configuration which surrounds the rotation axis A1. The inner circumferential edge of the lower surface 36L of the shielding member 33 defines an upper central opening 38 which is open in the central portion of the lower surface 36L of the shielding member 33. The inner circumferential surface of the shielding member 33 defines a through hole which extends upward from the upper central opening 38. A center nozzle 45 is inserted into the through hole of the shielding member 33. When the shielding member 33 is viewed from below, the center nozzle 45 is arranged within the upper central opening 38 of the shielding member 33.

As shown in FIG. 9, a shielding member raising/lowering unit 31 is coupled to the shielding member 33 via a support shaft 100 which extends upward from the shielding member 33. The center nozzle 45 is coupled to the shielding member raising/lowering unit 31. The shielding member raising/lowering unit 31 vertically raises and lowers the shielding member 33 between an upper position (the position of the shielding member 33 indicated by solid lines in FIG. 9) and a lower position (the position of the shielding member 33 indicated by alternate long and two short dashed lines in FIG. 9). The center nozzle 45 is vertically moved between the upper position and the lower position together with the shielding member 33.

Figure 11:
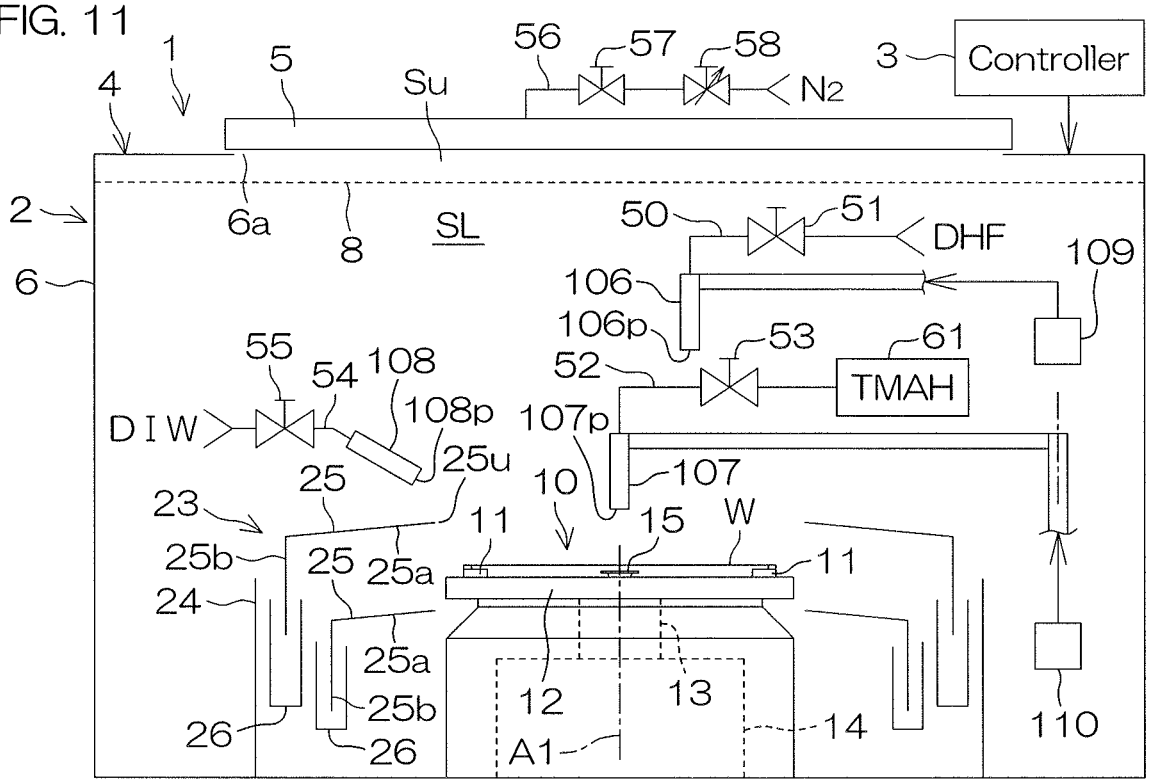
FIG. 11 is a schematic view of the interior of a processing unit according to a third preferred embodiment of the present invention when the interior is viewed horizontally.

The upper position of the shielding member 33 is a retraction position in which the lower surface 36L of the shielding member 33 is separated upward from the upper surface of the substrate W such that scan nozzles (see a first chemical liquid nozzle 106 and a second chemical liquid nozzle 107 in FIG. 11) can enter between the upper surface of the substrate W and the lower surface 36L of the shielding member 33. The lower position of the shielding member 33 is a proximate position in which the lower surface 36L of the shielding member 33 is close to the upper surface of the substrate W such that the scan nozzles cannot enter between the upper surface of the substrate W and the lower surface 36L of the shielding member 33. The shielding member raising/lowering unit 31 positions the shielding member 33 in an arbitrary position from the lower position to the upper position.

A first chemical liquid piping 50, a second chemical liquid piping 52 and an upper rinse liquid piping 54 are connected to the center nozzle 45. An upper gas piping 56 is connected not to the center nozzle 45 but to an upper tubular path 39 defined between the inner circumferential surface of the shielding member 33 and the outer circumferential surface of the center nozzle 45. The nitrogen gas supplied from the upper gas piping 56 to the upper tubular path 39 flows downward within the upper tubular path 39 while flowing in the circumferential direction within the upper tubular path 39. Then, the nitrogen gas flows downward from the upper central opening 38 which is open in the central portion of the lower surface 36L of the shielding member 33. When the shielding member 33 is arranged in the lower position, the nitrogen gas flowing out from the upper central opening 38 flows outward in the space between the upper surface of the substrate W and the lower surface 36L of the shielding member 33. Thus, the space between the substrate W and the shielding member 33 is filled with the nitrogen gas.

The shielding member 33 includes the outer openings 101 which are opened in the lower surface 36L of the shielding member 33 and an internal path 102 which guides the gas to the outer openings 101. The internal path 102 is provided within the shielding member 33. The individual outer openings 101 are extended downward from the internal path 102. The outer openings 101 face the outer circumferential portion of the upper surface of the substrate W. The outer openings 101 may be extended vertically in a downward direction from the internal path 102 or may be extended obliquely downward from the internal path 102. FIG. 9 shows an example where the outer openings 101 are extended obliquely downward toward the periphery of the substrate W.

As shown in FIG. 10, the outer openings 101 are arranged on a circle which has a center arranged on the rotation axis A1. The internal path 102 surrounds the rotation axis A1. When the shielding member 33 is viewed from below, the internal path 102 overlaps the outer openings 101. The internal path 102 surrounds the upper central opening 38 of the shielding member 33. Similarly, the outer openings 101 surround the upper central opening 38 of the shielding member 33.

As shown in FIG. 9, the substrate processing apparatus 1 includes an upper gas piping 103 which guides the gas via the internal path 102 to the outer openings 101, an upper gas valve 104 which is interposed in the upper gas piping 103 and an upper gas flow rate adjusting valve 105 which changes the flow rate of the gas supplied from the upper gas piping 103 to the center nozzle 45. The upper gas piping 103 is connected to the internal path 102 of the shielding member 33.

When the upper gas valve 104 is opened, the nitrogen gas as an example of an inert gas is supplied from the upper gas piping 103 to the internal path 102 at a flow rate corresponding to the degree of opening of the upper gas flow rate adjusting valve 105, and flows in the circumferential direction within the internal path 102. The nitrogen gas within the internal path 102 is supplied to each of the outer openings 101 and is discharged downward from the outer openings 101. Thus, the nitrogen gas is supplied to the space between the substrate W and the shielding member 33. The upper gas valve 104 and the upper gas flow rate adjusting valve 105 are included in the atmosphere oxygen concentration change unit 97 (see FIG. 8).

In the second preferred embodiment, in addition to the actions and effects of the first preferred embodiment, the following actions and effects can be obtained. Specifically, in the second preferred embodiment, the upper central opening 38 and the outer openings 101 are provided in the lower surface 36L of the shielding member 33. The upper central opening 38 faces the central portion of the upper surface of the substrate W. The outer openings 101 are arranged outside the upper central opening 38. The nitrogen gas flowing out from the upper central opening 38 flows outward in the space between the substrate W and the shielding member 33. Similarly, the nitrogen gas flowing out from the outer openings 101 flows outward in the space between the substrate W and the shielding member 33. Hence, as compared with a case where the outer openings 101 are not provided, another gas is unlikely to flow in the space between the substrate W and the shielding member 33. Thus, it is possible to more accurately control the oxygen concentration in the space between the substrate W and the shielding member 33.

Third Preferred Embodiment

A third preferred embodiment mainly differs from the first preferred embodiment in that the shielding member 33 is omitted and that an inert gas is supplied by an FFU 5 into the chamber 4.

Figure 12:
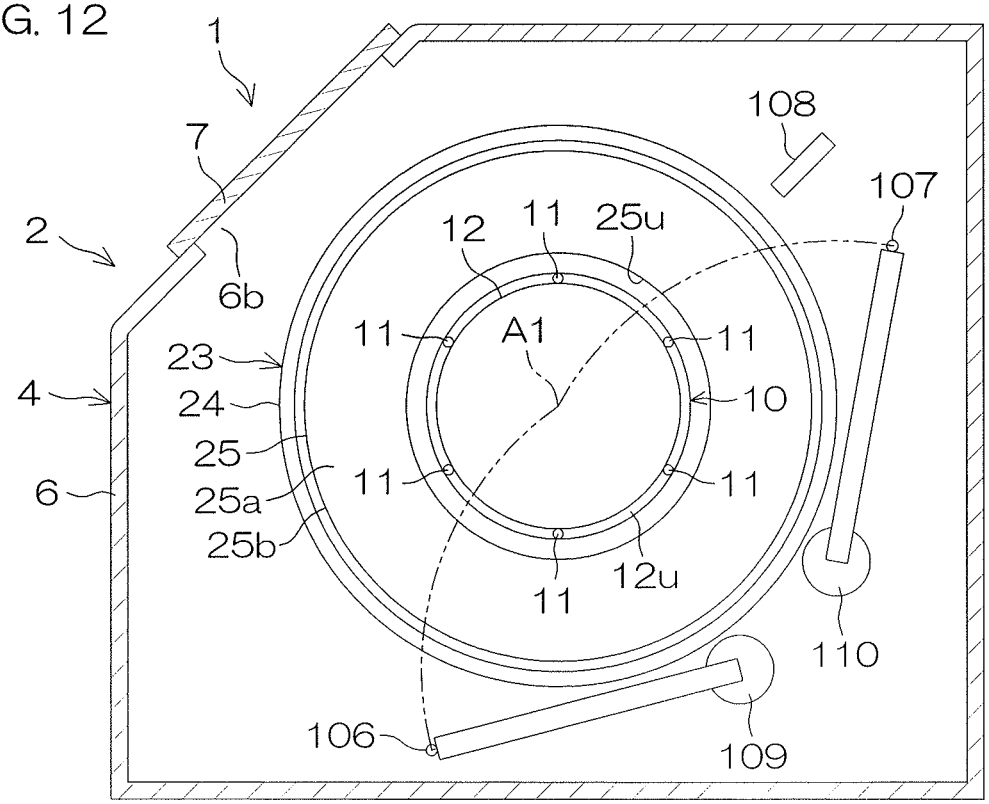
FIG. 12 is a schematic view of the interior of the processing unit according to the third preferred embodiment of the present invention when the interior is viewed from above.

FIG. 11 is a schematic view of the interior of a processing unit 2 according to the third preferred embodiment of the present invention when the interior is viewed horizontally. FIG. 12 is a schematic view of the interior of the processing unit 2 according to the third preferred embodiment of the present invention when the interior is viewed from above. In FIG. 11 to FIG. 12, components equivalent to the above described components shown in FIG. 1 to FIG. 10 are designated by the same reference characters as in FIG. 1, etc., and description thereof is omitted.

As shown in FIG. 11, the processing unit 2 includes a first chemical liquid nozzle 106 which discharges a first chemical liquid downward toward the upper surface of the substrate W, a second chemical liquid nozzle 107 which discharges a second chemical liquid downward toward the upper surface of the substrate W and a rinse liquid nozzle 108 which discharges a rinse liquid downward toward the upper surface of the substrate W. The first chemical liquid piping 50, the second chemical liquid piping 52 and the upper rinse liquid piping 54 are respectively connected to the first chemical liquid nozzle 106, the second chemical liquid nozzle 107 and the rinse liquid nozzle 108.

The rinse liquid nozzle 108 is fixed to the partition wall 6 of a chamber 4. The rinse liquid discharged from the rinse liquid discharge port 108p of the rinse liquid nozzle 108 reaches the central portion of the upper surface of the substrate W. The rinse liquid nozzle 108 may be a scan nozzle which moves the landing position with respect to the upper surface of the substrate W. In other words, a nozzle movement unit which moves the rinse liquid nozzle 108 horizontally may be provided in the processing unit 2.

The first chemical liquid nozzle 106 and the second chemical liquid nozzle 107 are scan nozzles. As shown in FIG. 12, the processing unit 2 includes a first nozzle movement unit 109 that moves the first chemical liquid nozzle 106 horizontally between a processing position in which the chemical liquid discharged from the first chemical liquid discharge port 106p of the first chemical liquid nozzle 106 is supplied to the upper surface of the substrate W and a retraction position in which the first chemical liquid nozzle 106 is arranged around the substrate W in plan view. The processing unit 2 includes a second nozzle movement unit 110 that moves the second chemical liquid nozzle 107 horizontally between a processing position in which the chemical liquid discharged from the second chemical liquid discharge port 107p of the second chemical liquid nozzle 107 is supplied to the upper surface of the substrate W and a retraction position in which the second chemical liquid nozzle 107 is arranged around the substrate W in plan view.

The first nozzle movement unit 109 may be a turning unit which moves the first chemical liquid nozzle 106 horizontally along an arc-shaped path that passes through the central portion of the substrate W in plan view or may be a slide unit which moves the first chemical liquid nozzle 106 horizontally along a linear path that passes through the central portion of the substrate W in plan view. Similarly, the second nozzle movement unit 110 may be a turning unit or may be a slide unit. FIG. 12 shows an example where the first nozzle movement unit 109 and the second nozzle movement unit 110 are turning units.

An upper gas piping 56 which guides the nitrogen gas as an example of the inert gas is connected to the FFU 5. When an upper gas valve 57 is opened, the nitrogen gas is supplied from the upper gas piping 56 to the FFU 5 at a flow rate corresponding to the degree of opening of the upper gas flow rate adjusting valve 58, and is fed by the FFU 5 to an upper space Su within the chamber 4. The nitrogen gas supplied to the upper space Su hits a rectifying plate 8 so as to diffuse in the upper space Su and flows downward through a plurality of through holes provided in the entire region of the rectifying plate 8.

Since the upper surface of the substrate W faces directly the lower surface of the rectifying plate 8, the nitrogen gas flowing downward from the rectifying plate 8 is moved to the upper surface of the substrate W without being interrupted by the shielding member 33 (see FIG. 2). Thereafter, the nitrogen gas is sucked into a processing cup 23 and is discharged via an exhaust duct 9 (see FIG. 2) from the chamber 4. Thus, the interior of the chamber 4 is filled with the nitrogen gas, and thus the oxygen concentration within the chamber 4 is lowered. The oxygen concentration within the chamber 4 is changed according to the degree of opening of the upper gas valve 57 and the upper gas flow rate adjusting valve 58.

When a first chemical liquid supply step (step S3 in FIG. 6) is performed, the first nozzle movement unit 109 moves the first chemical liquid nozzle 106 from a standby position to the processing position. Thereafter, the first chemical liquid valve 51 is opened so as to cause the first chemical liquid nozzle 106 to start the discharge of the first chemical liquid. When the first chemical liquid nozzle 106 discharges the first chemical liquid, the first nozzle movement unit 109 may move the first chemical liquid nozzle 106 such that the landing position of the first chemical liquid is moved along a path passing through the central portion of the upper surface of the substrate W within the upper surface of the substrate W or may stop the first chemical liquid nozzle 106 such that the landing position of the first chemical liquid is positioned in the central portion of the upper surface of the substrate W.

In a second chemical liquid supply step (step S5 in FIG. 6), instead of the first chemical liquid nozzle 106, the first chemical liquid valve 51 and the first nozzle movement unit 109, the second chemical liquid nozzle 107, the second chemical liquid valve 53 and the second nozzle movement unit 110 are used. In a first rinse liquid supply step (step S4 in FIG. 6) and a second rinse liquid supply step (step S6 in FIG. 6), the upper rinse liquid valve 55 is opened and closed so as to discharge the rinse liquid from the rinse liquid nozzle 108 toward the central portion of the upper surface of the substrate W.

In the third preferred embodiment, in addition to the actions and effects of the first preferred embodiment, the following actions and effects can be obtained. Specifically, in the third preferred embodiment, the nitrogen gas as an example of a low oxygen gas flows from the upper end portion of the chamber 4 into the chamber 4. The nitrogen gas flowing into the chamber 4 flows toward the lower end portion of the chamber 4 and is discharged from the lower end portion of the chamber 4 to the outside of the chamber 4. Thus, the interior of the chamber 4 is filled with the nitrogen gas, and thus the oxygen concentration in the atmosphere is lowered. Hence, the oxygen concentration in the atmosphere can be lowered without provision of members such as the shielding member 33 arranged above the substrate W. Thus, it is possible to downsize the chamber 4.

Fourth Preferred Embodiment

Figure 13:
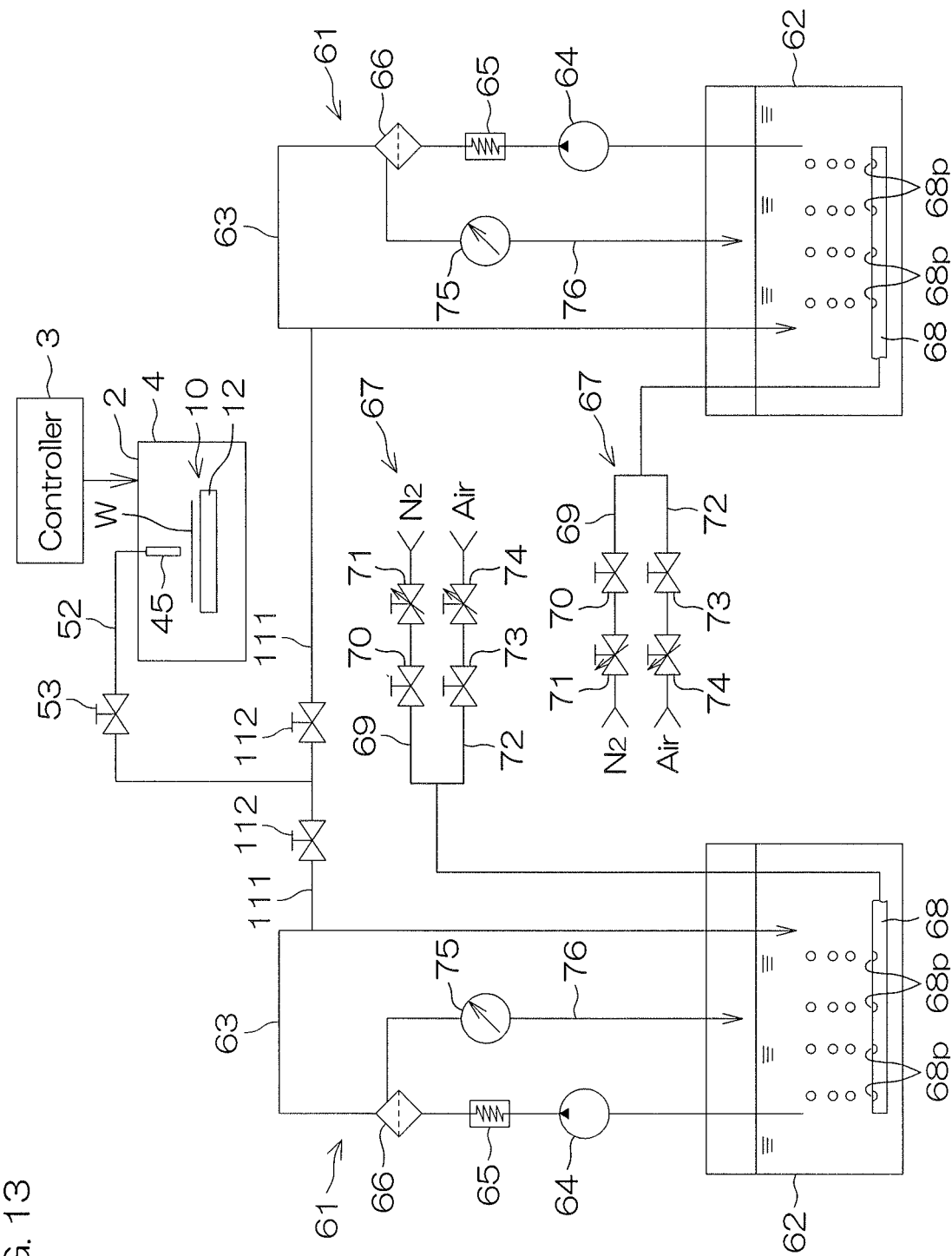
FIG. 13 is a schematic view showing chemical liquid producing units and dissolved oxygen concentration change units according to a fourth preferred embodiment.

A fourth preferred embodiment mainly differs from the first preferred embodiment in that a plurality of groups of chemical liquid producing units 61 and dissolved oxygen concentration change units 67 which correspond to the same processing unit 2 are provided. FIG. 13 shows an example where two groups of the chemical liquid producing units 61 and the dissolved oxygen concentration change units 67 are provided.

FIG. 13 shows a schematic view showing the chemical liquid producing units 61 and the dissolved oxygen concentration change units 67 according to the fourth preferred embodiment. In FIG. 13, components equivalent to the above described components shown in FIG. 1 to FIG. 12 are designated by the same reference characters as in FIG. 1, etc., and description thereof is omitted.

In the following description, "first" may be added to the front of an arrangement positioned on the left side of FIG. 13, and "second" may be added to the front of an arrangement positioned on the right side of FIG. 13. For example, a tank 62 on the left side of FIG. 13 may be referred to as a "first tank 62A," and a tank 62 on the right side of FIG. 13 may be referred to as a "second tank 62B."

The chemical liquid producing unit 61 includes a relay piping 111 which guides a chemical liquid within a circulation piping 63 to a second chemical liquid piping 52 and relay valves 112 which are interposed in the relay piping 111. In the case of an example shown in FIG. 13, instead of the two relay valves 112, a three-way valve may be used. When the first relay valve 112A (the relay valve 112 on the left side) is opened, the chemical liquid within the first tank 62A (the tank 62 on the left side) is supplied via the second chemical liquid piping 52 to a center nozzle 45. When the second relay valve 112B (the relay valve 112 on the right side) is opened, the chemical liquid within the second tank 62B (the tank 62 on the right side) is supplied via the second chemical liquid piping 52 to the center nozzle 45.

The chemical liquid within the first tank 62A and the chemical liquid within the second tank 62B have different dissolved oxygen concentrations from each other. In other words, the dissolved oxygen concentrations of the chemical liquids are adjusted as follows. When the setting value of the dissolved oxygen concentration of the chemical liquid supplied to the upper surface of the substrate W, that is, the setting dissolved oxygen concentration is determined, the controller 3 selects which one of the first tank 62A and the second tank 62B stores the chemical liquid having the dissolved oxygen concentration close to the setting dissolved oxygen concentration that is determined. Then, the controller 3 discharges, in a second chemical liquid supply step (step S5 in FIG. 6), the chemical liquid within the selected tank to the center nozzle 45. For example, when the first tank 62A is selected, the first relay valve 112A and the second chemical liquid valve 53 are opened, and thus the chemical liquid within the first tank 62A is discharged from the center nozzle 45 toward the upper surface of the substrate W.

In the fourth preferred embodiment, in addition to the actions and effects of the first preferred embodiment, the following actions and effects can be obtained. Specifically, the etching liquids having different dissolved oxygen concentrations from each other are stored in the first tank 62A and the second tank 62B. The determined setting dissolved oxygen concentration is compared with a first dissolved oxygen concentration which indicates the dissolved oxygen concentration of the etching liquid within the first tank 62A and a second dissolved oxygen concentration which indicates the dissolved oxygen concentration of the etching liquid within the second tank 62B. When the dissolved oxygen concentration of the etching liquid within the first tank 62A is equal or close to the determined setting dissolved oxygen concentration, the etching liquid within the first tank 62A is supplied to the upper surface of the substrate W. On the other hand, when the dissolved oxygen concentration of the etching liquid within the second tank 62B is equal or close to the determined setting dissolved oxygen concentration, the etching liquid within the second tank 62B is supplied to the upper surface of the substrate W.

It is difficult to change immediately the dissolved oxygen concentration of the etching liquid. Hence, when the dissolved oxygen concentration of the etching liquid within the same tank 62 is changed, a certain amount of time is needed. By contrast, when the etching liquids having different dissolved oxygen concentrations from each other are previously stored in the first tank 62A and the second tank 62B, the dissolved oxygen concentration of the etching liquid supplied to the upper surface of the substrate W can be changed immediately. Thus, it is possible to reduce the downtime (time during which the substrate W processing cannot be executed) of the substrate processing apparatus 1, and thus it is possible to reduce the amount of decrease in the throughput (the number of substrates W processed per unit time) of the substrate processing apparatus 1.

Other Preferred Embodiments

The present invention is not restricted to the contents of the above described preferred embodiments and various modifications are possible.

For example, the etching liquid such as the TMAH may be supplied not to the upper surface of the substrate W but to the lower surface of the substrate W. Alternatively, the etching liquid may be supplied to both the upper surface and the lower surface of the substrate W. In these cases, the lower surface nozzle 15 may be used to discharge the etching liquid.

The controller 3 may cause a plurality of liquid discharge ports to simultaneously discharge the processing liquid toward a plurality of positions away in the radial direction of the substrate W so as to supply the processing liquid to the upper surface or the lower surface of the substrate W. In this case, at least one of the flow rate, the temperature and the concentration of the chemical liquid which is discharged may be changed for each of the liquid discharge ports.

Similarly, the controller 3 may cause a plurality of gas discharge ports to simultaneously discharge the gas toward a plurality of positions away in the radial direction of the substrate W so as to supply the gas to the upper surface or the lower surface of the substrate W. For example, a plurality of gas discharge ports including the lower central opening 18 may be provided in the upper surface 12u of the spin base 12.

The controller 3 may previously determine the setting atmosphere oxygen concentration instead of previously determining the setting dissolved oxygen concentration.

The substrate processing apparatus 1 is not restricted to an apparatus for processing a disc-shaped substrate W, and may be an apparatus for processing a polygonal substrate W.

Two or more arrangements among all the arrangements described above may be combined. Two or more steps among all the steps described above may be combined.

The FFU 5 is an example of a fan unit. The spin chuck 10 is an example of a substrate holding unit. The spin base 12 is an example of an opposed member. The upper surface 12u is an example of an opposed surface. The lower surface nozzle 15 is an example of an etching liquid supply unit. The lower tubular path 19 is an example of a low oxygen gas supply unit. The lower gas piping 20 is an example of the low oxygen gas supply unit. The lower gas valve 21 is an example of an atmosphere oxygen concentration change unit. The lower gas flow rate adjusting valve 22 is an example of the atmosphere oxygen concentration change unit. The shielding member is an example of an opposed member 33. The lower surface 36L is an example of the opposed surface. The upper tubular path 39 is an example of the low oxygen gas supply unit. The center nozzle 45 is an example of the etching liquid supply unit. The upper gas piping 56 is an example of the low oxygen gas supply unit. The upper gas valve 57 is an example of the atmosphere oxygen concentration change unit. The upper gas flow rate adjusting valve 58 is an example of the atmosphere oxygen concentration change unit. The dissolved oxygen concentration change unit 67 is an example of a dissolved oxygen concentration change unit. The atmosphere oxygen concentration change unit 97 is an example of the atmosphere oxygen concentration change unit. The upper gas piping 103 is an example of the low oxygen gas supply unit. The upper gas valve 104 is an example of the atmosphere oxygen concentration change unit. The upper gas flow rate adjusting valve 105 is an example of the atmosphere oxygen concentration change unit. The second chemical liquid nozzle 107 is an example of the etching liquid supply unit.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A substrate processing method comprising:
    performing a first oxygen concentration determination step of determining one of (a) a setting dissolved oxygen concentration which indicates a setting value of a dissolved oxygen concentration of an etching liquid and (b) a setting atmosphere oxygen concentration which indicates a setting value of an oxygen concentration in an atmosphere in contact with the etching liquid held on a main surface of a substrate, based on a required etching amount which indicates a required value of an amount of etching of the main surface of the substrate;
    performing a second oxygen concentration determination step of determining the other of (a) the setting dissolved oxygen concentration and (b) the setting atmosphere oxygen concentration, based on the required etching amount, and based on the one of (a) the setting dissolved oxygen concentration and (b) the setting atmosphere oxygen concentration determined in the first oxygen concentration determination step;
    performing a low oxygen gas supply step of causing a low oxygen gas, whose oxygen concentration is lower than an oxygen concentration of air and equal or approached to the setting atmosphere oxygen concentration determined in the first oxygen concentration determination step or the second oxygen concentration determination step, to flow into a chamber that houses the substrate; and
    performing an etching step of etching the main surface of the substrate by supplying an entire region of the main surface of the substrate held horizontally with the etching liquid whose dissolved oxygen is reduced such that the dissolved oxygen concentration of the etching liquid is equal or approached to the setting dissolved oxygen concentration determined in the first oxygen concentration determination step or the second oxygen concentration determination step, while causing the low oxygen gas that has flowed into the chamber in the low oxygen gas supply step to be in contact with the etching liquid held on the main surface of the substrate.

2. The substrate processing method according to claim 1, wherein one of the first oxygen concentration determination step and the second oxygen concentration determination step includes either a step of determining, as the setting dissolved oxygen concentration, a value larger than a minimum value in a range of values which can be set as the setting dissolved oxygen concentration or a step of determining, as the setting atmosphere oxygen concentration, a value larger than a minimum value in a range of values which can be set as the setting atmosphere oxygen concentration.

3. The substrate processing method according to claim 1, wherein the etching step includes a liquid discharge step of causing a liquid discharge port to discharge the etching liquid, whose dissolved oxygen is reduced such that the dissolved oxygen concentration of the etching liquid is equal or approached to the setting dissolved oxygen concentration determined in the first oxygen concentration determination step or the second oxygen concentration determination step, toward the main surface of the substrate held horizontally, while locating a landing position of the etching liquid, where the etching liquid discharged from the liquid discharge port first contacts the main surface of the substrate, in a central portion of the main surface of the substrate after start of the discharge of the etching liquid until stop of the discharge of the etching liquid.

4. The substrate processing method according to claim 3, wherein the second oxygen concentration determination step is a step of determining, based on the required etching amount and the one of the setting dissolved oxygen concentration and the setting atmosphere oxygen concentration determined in the first oxygen concentration determination step, the other of the setting dissolved oxygen concentration and the setting atmosphere oxygen concentration such that a distribution of the amount of etching over the main surface of the substrate is formed in a shape of a cone or an inverted cone.

5. The substrate processing method according to claim 1, wherein the first oxygen concentration determination step is a step of determining the setting dissolved oxygen concentration based on the required etching amount, and
    the second oxygen concentration determination step is a step of determining the setting atmosphere oxygen concentration based on the required etching amount and the setting dissolved oxygen concentration determined in the first oxygen concentration determination step.

6. The substrate processing method according to claim 1, wherein the low oxygen gas supply step includes a step of causing the low oxygen gas to flow from an opening provided in an opposed surface of an opposed member to a space between the main surface of the substrate and the opposed surface of the opposed member, while causing the opposed surface of the opposed member which is movable within the chamber to face the main surface of the substrate.

7. The substrate processing method according to claim 6, wherein the low oxygen gas supply step includes
    a step of causing the low oxygen gas to flow from a central opening, which is provided in the opposed surface of the opposed member and faces a central portion of the main surface of the substrate, to the space between the main surface of the substrate and the opposed surface of the opposed member and
    a step of causing the low oxygen gas to flow from an outer opening, which is provided in the opposed surface of the opposed member and faces a portion of the main surface of the substrate other than the central portion of the main surface of the substrate, to the space between the main surface of the substrate and the opposed surface of the opposed member.

8. The substrate processing method according to claim 1, wherein the low oxygen gas supply step includes a step of causing the low oxygen gas to flow from an upper end portion of the chamber into the chamber, while causing a gas within the chamber to flow out from a lower end portion of the chamber.

9. The substrate processing method according to claim 1, further comprising:

performing a first dissolved oxygen concentration adjustment step of lowering the dissolved oxygen concentration of the etching liquid within a first tank to a first dissolved oxygen concentration by reducing the dissolved oxygen in the etching liquid; and performing a second dissolved oxygen concentration adjustment step of lowering the dissolved oxygen concentration of the etching liquid within a second tank to a second dissolved oxygen concentration different from the first dissolved oxygen concentration by reducing the dissolved oxygen in the etching liquid, wherein the etching step includes performing a selection step of selecting, among the first tank and the second tank, a tank that stores the etching liquid having the dissolved oxygen concentration closer to the setting dissolved oxygen concentration determined in the first oxygen concentration determination step or the second oxygen concentration determination step and performing a liquid discharge step of discharging the etching liquid within the tank selected in the selection step toward the main surface of the substrate held horizontally.

10. The substrate processing method according to claim 1, wherein the etching step is a step of etching a polysilicon film formed on the main surface of the substrate by supplying the entire region of the main surface of the substrate held horizontally with the etching liquid whose dissolved oxygen is reduced such that the dissolved oxygen concentration of the etching liquid is equal or approached to the setting dissolved oxygen concentration determined in the first oxygen concentration determination step or the second oxygen concentration determination step while causing the low oxygen gas that has flowed into the chamber in the low oxygen gas supply step to be in contact with the etching liquid held on the main surface of the substrate.

* * * * *